(12) United States Patent
Free et al.

(10) Patent No.: US 10,052,856 B2
(45) Date of Patent: Aug. 21, 2018

(54) METHODS OF USING NANOSTRUCTURED TRANSFER TAPE AND ARTICLES MADE THEREFROM

(71) Applicant: 3M INNOVATIVE PROPERTIES COMPANY, St. Paul, MN (US)

(72) Inventors: Michael Benton Free, St. Paul, MN (US); Martin B. Wolk, Woodbury, MN (US); Terry O. Collier, Woodbury, MN (US); Mieczyslaw H. Mazurek, Roseville, MN (US); Evan L. Schwartz, Vadnais Heights, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 15/257,099

(22) Filed: Sep. 6, 2016

(65) Prior Publication Data

US 2016/0375666 A1 Dec. 29, 2016

Related U.S. Application Data

(62) Division of application No. 13/723,675, filed on Dec. 21, 2012.

(51) Int. Cl.
*B32B 37/04* (2006.01)
*B32B 37/06* (2006.01)
(Continued)

(52) U.S. Cl.
CPC ........ *B32B 37/025* (2013.01); *B29C 35/0805* (2013.01); *B29C 35/0894* (2013.01);
(Continued)

(58) Field of Classification Search
CPC .... B29C 2035/0827; B29C 2035/0833; B29C 2059/023; B29C 35/0805; B29C 35/0894;
(Continued)

(56) References Cited

U.S. PATENT DOCUMENTS

RE24,906 E    12/1960   Ulrich
4,472,480 A    9/1984   Olson
(Continued)

FOREIGN PATENT DOCUMENTS

KR    2005/0004436    1/2005
WO    WO 2008/118610    10/2008
(Continued)

OTHER PUBLICATIONS

Written Opinion of WO2014/099388.*
(Continued)

*Primary Examiner* — Sonya Mazumdar
(74) *Attorney, Agent, or Firm* — Jonathan L. Tolstedt

(57) ABSTRACT

A method of making patterned structured solid surfaces is disclosed that includes filling a structured template with backfill material to produce a structured transfer film, patternwise curing the backfill material to produce cured areas and uncured areas in the structured transfer film, and laminating the structured transfer film to a receptor substrate. The structured template is capable of being removed to form structured and unstructured backfill layers. The structured and unstructured backfill layers may then be blanket cured. The backfill layer can include at least two different materials, one of which can be an adhesion promotion layer. In some embodiments the backfill layer includes a silsesquioxane such as polyvinyl silsesquioxane. The structured transfer film is a stable intermediate that can be covered temporarily with a release liner for storage and handling.

19 Claims, 14 Drawing Sheets

(51) Int. Cl.

| | | |
|---|---|---|
| *B32B 38/10* | (2006.01) | |
| *B29C 65/16* | (2006.01) | |
| *B32B 37/00* | (2006.01) | |
| *B29C 35/08* | (2006.01) | |
| *B29C 59/02* | (2006.01) | |
| *G03F 7/00* | (2006.01) | |
| *B29C 65/52* | (2006.01) | |
| *G03F 7/20* | (2006.01) | |
| *B29C 41/24* | (2006.01) | |
| *B32B 27/06* | (2006.01) | |
| *C23C 16/455* | (2006.01) | |
| *B29K 83/00* | (2006.01) | |
| *B29L 9/00* | (2006.01) | |
| *B29C 37/00* | (2006.01) | |
| *B29L 31/34* | (2006.01) | |
| *B32B 38/00* | (2006.01) | |

(52) U.S. Cl.
CPC .......... *B29C 41/24* (2013.01); *B29C 59/026* (2013.01); *B29C 65/528* (2013.01); *B32B 27/06* (2013.01); *B32B 38/10* (2013.01); *C23C 16/455* (2013.01); *G03F 7/0002* (2013.01); *G03F 7/2014* (2013.01); *B29C 37/0067* (2013.01); *B29C 2035/0827* (2013.01); *B29C 2035/0833* (2013.01); *B29C 2059/023* (2013.01); *B29K 2083/00* (2013.01); *B29L 2009/005* (2013.01); *B29L 2031/3475* (2013.01); *B32B 2038/0076* (2013.01); *B32B 2383/00* (2013.01); *B32B 2457/20* (2013.01)

(58) Field of Classification Search
CPC ... B29C 37/0067; B29C 41/24; B29C 59/026; B29C 65/528; B32B 2038/0076; B32B 2383/00; B32B 2457/20; B32B 27/06; B32B 37/025; B32B 38/10; B29K 2083/00; B29L 2009/005; B29L 2031/3475; G03F 7/0002; G03F 7/2014; C23C 16/455
USPC .................. 156/247, 249, 272.8, 275.5, 289
See application file for complete search history.

(56) References Cited

U.S. PATENT DOCUMENTS

| 4,567,073 | A | 1/1986 | Larson |
| 4,614,667 | A | 9/1986 | Larson |
| 5,449,540 | A | 9/1995 | Calhoun |
| 5,491,015 | A | 2/1996 | Reeves |
| 5,691,846 | A | 11/1997 | Benson, Jr. |
| 6,366,013 | B1 | 4/2002 | Leenders |
| 6,396,071 | B1 | 5/2002 | Nishi |
| 6,396,079 | B1 | 5/2002 | Hayashi |
| 6,521,324 | B1 | 2/2003 | Debe |
| 6,770,337 | B2 | 8/2004 | Debe |
| 6,849,558 | B2 | 2/2005 | Schaper |
| 6,858,253 | B2 | 2/2005 | Williams |
| 7,384,809 | B2 | 6/2008 | Donofrio |
| 8,293,354 | B2 | 10/2012 | Fu |
| 8,545,987 | B2 | 10/2013 | Strader |
| 2004/0190102 | A1* | 9/2004 | Mullen ............... B29C 35/0894 359/237 |
| 2004/0241393 | A1 | 12/2004 | Thakkar |
| 2005/0118352 | A1 | 6/2005 | Suwa |
| 2006/0004166 | A1 | 1/2006 | Olson |
| 2006/0270806 | A1 | 11/2006 | Hale |
| 2007/0298176 | A1 | 12/2007 | DiPietro |
| 2008/0233404 | A1 | 9/2008 | Wolk |
| 2008/0252980 | A1 | 10/2008 | Hebrink |
| 2009/0015142 | A1 | 1/2009 | Potts |
| 2009/0256287 | A1 | 10/2009 | Fu |
| 2009/0263668 | A1 | 10/2009 | David |
| 2009/0322219 | A1 | 12/2009 | Wolk |
| 2010/0006211 | A1 | 1/2010 | Wolk |
| 2010/0104807 | A1 | 4/2010 | Chiu |
| 2010/0151207 | A1 | 6/2010 | Hansen |
| 2010/0160577 | A1 | 6/2010 | Hirano |
| 2010/0188751 | A1 | 7/2010 | Clarke |
| 2011/0091694 | A1 | 4/2011 | Hayashi |
| 2011/0143129 | A1 | 6/2011 | Padiyath |
| 2011/0182805 | A1 | 7/2011 | DeSimone |
| 2011/0278772 | A1 | 11/2011 | Inamiya |
| 2011/0305787 | A1 | 12/2011 | Ishii |
| 2012/0099323 | A1 | 4/2012 | Thompson |
| 2012/0125880 | A1 | 5/2012 | Slafer |
| 2013/0011608 | A1 | 1/2013 | Wolk |
| 2013/0319522 | A1 | 12/2013 | Kioke |
| 2014/0021492 | A1 | 1/2014 | Wolk |
| 2014/0178646 | A1 | 6/2014 | Wolk |
| 2016/0087246 | A1 | 3/2016 | Schwartz |
| 2016/0096316 | A1 | 4/2016 | Wolk |

FOREIGN PATENT DOCUMENTS

| WO | WO 2011/088161 | 7/2011 | |
| WO | WO 2012/077738 | 6/2012 | |
| WO | WO 2012/082536 | 6/2012 | |
| WO | WO 2012/166460 | 12/2012 | |
| WO | WO 2012/166462 | 12/2012 | |
| WO | WO 2014099388 A1 * | 6/2014 | ......... B29C 35/0894 |

OTHER PUBLICATIONS

English translation of WO2012/077738.*
Cannistra, "Micro-transfer Molding of SU-8 Micro-optics", Advanced Fabrication Technologies for Micro/Nano Optics and Photonics,Proc. of SPIE, 2008, vol. 6883, pp. 68830C1-68830C1-9.
Chiniwalla, "Multilayer Planarization of Polymer Dielectics", IEEE Transaction on Advanced packaging, Feb. 2001, vol. 24, No. 1, pp. 41-53.
Domanski, "Production and Characterization of Miro- and Nano-Features in Biomedical Alumina and Zirconia Ceramics Using a Tape Casting Route", Journal of Materials Science: Materials in Medicine, 2012, vol. 23, Issue 7, pp. 1637-1644.
Gale, "Replication Technology for Optical Microsystems",Optics and Lasers in Engineering, 2005, vol. 43, pp. 373-386.
Kim, "Effect of the Substrate Pretreatments on the Leakage Current in the Low-Temperature Poly-Si TFTs", Mat. Res. Soc. Symp. Proc., 1997, vol. 448, pp. 419-423.
Kondoh, "Surface treatment of Sheet Glass. Present Status and Future Prospects", Journal of Non-Crystalline Solids, 1994, vol. 178, pp. 189-198.
Kress, "Classification of Digital Optics", Applied Digital Optics: Form Micro-Optics to Nan photonics, Chapter II, pp. 15-20 (2009).
Kucera, "Structuring of Ceramic Green Tapes by Embossing", pp. 28-29 (2011).
Kucera, "Structuring of UV-Curable Ceramic Green Tapes", Proceedings of the 8$^{th}$ International Coverence on Multi-Material Micro Manufacture, 2011, pp. 198-171.
Peng, "Hybrid Mold Reversal Imprint for Three-Dimensional and Selective Patterning" J. Vac. Sci. Technol. B 24(6), 2006, pp. 2968-2972.
Ro, "High-Modulus Spin-On Organosilicate Glasses for Nanoporous Applications", Advanced Materials, Feb. 2007, vol. 19, No. 5, pp. 705-710.
Rosqvist, "Soft Micromolding and Lamination of Piezoceramic Thick Films", Sensors and Actuators 97-98, 2002, pp. 512-519.
Shan,"A Micro Roller Embossing Process for Structuring Large-Area Substrates of Laminated Ceramic Green Tapes", Microsystem Technologies—Special Issue on Design, Test, Integration and Packaging of MEMS/MOEMS, 2009, vol. 15 Issue 8, pp. 1319-1325.
Shaw, "Negative Photoresists for Optical Lithography", IBM Journal Research Development, 1997, vol. 41, No. 1/2, pp. 81-94.
PCT International Search Report for PCT/US2013/073227.

* cited by examiner

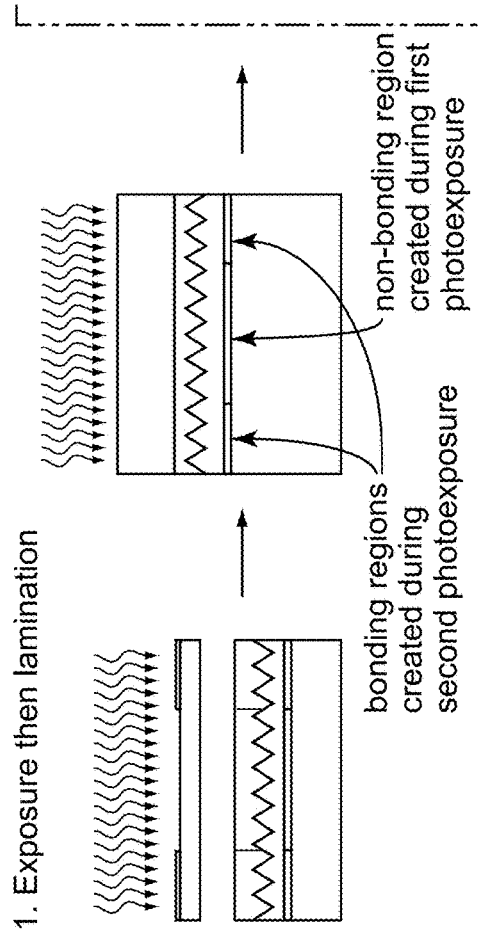
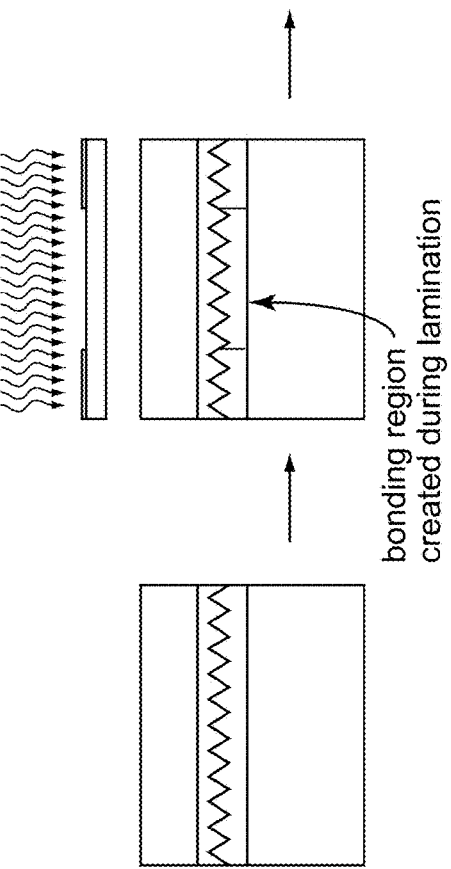
FIG. 11A
FIG. 11B

METHODS OF USING NANOSTRUCTURED TRANSFER TAPE AND ARTICLES MADE THEREFROM

BACKGROUND

Nanostructures and microstructures on glass substrates are used for a variety of applications in display, lighting, architecture and photovoltaic devices. In display devices the structures can be used for light extraction or light distribution. In lighting devices the structures can be used for light extraction, light distribution, and decorative effects. In photovoltaic devices the structures can be used for solar concentration and antireflection. Patterning or otherwise forming nanostructures and microstructures on large glass substrates can be difficult and not cost-effective.

Lamination transfer methods that use a structured backfill layer inside a nanostructured sacrificial template layer as a lithographic etch mask have been disclosed. The backfill layer can be a glass-like material. However, these methods require removing the sacrificial template layer from the backfill layer while leaving the structured surface of the backfill layer substantially intact. The sacrificial template layer is typically removed by a dry etching process using oxygen plasma, a thermal decomposition process, or a dissolution process.

SUMMARY

Accordingly, a need exists for fabricating nanostructures and microstructures in a cost-effective manner on a continuous carrier film and then using the film to transfer or otherwise impart the structures onto glass substrates or other permanent receptor substrates. Additionally, a need exists for fabricating nanostructures and microstructures over a large area with high yields to meet the needs, for example, of large digital displays.

In one aspect, a method of making patterned structured solid surfaces is disclosed that includes filling a structured template with backfill material to produce a structured transfer film and laminating the structured transfer film to a receptor substrate. The receptor substrate comprises a patterned adhesion promotion layer. The template layer is capable of being removed from the backfill layer while leaving at least a portion of the structured surface of the backfill layer substantially intact. The backfill layer can include at least two different materials, one of which can be an adhesion promotion layer. In some embodiments the backfill layer includes a silsesquioxane such as polyvinyl silsesquioxane. The structured transfer film is a stable intermediate that can be covered temporarily with a release liner for storage and handling.

In another aspect a method of making structured solid surfaces is disclosed that includes filling a structured template with backfill material to produce a structured transfer film, laminating the structured transfer film to a receptor substrate, curing the sample, and removing the structured template layer, thereby leaving structured backfill material on the receptor substrate. In some embodiments, the backfill material includes a silsesquioxane. Typically the sample is cured photochemically.

In another aspect, a method of making structured solid surfaces is disclosed that includes filling a structured template with backfill material to produce a structured transfer film, laminating the structured transfer film to a receptor substrate, patternwise curing the backfill material to produce cured areas and uncured areas in the structured transfer film, removing the structured template allowing the uncured areas to reflow, and blanket curing the structured template. Patternwise curing can be performed by exposure through a mask or by rastered laser exposure. In some embodiments, the backfill material includes a silsesquioxane. The structured transfer film can be temporarily laminated to a release liner for storage and further handling.

In yet another aspect, a method of making structured solid surfaces is provided that includes filling a structured template with backfill material to produce a structured transfer film, patternwise curing the backfill material, laminating the structured transfer film to a receptor substrate, removing the structured template layer, and blanket curing the structured template layer. The patternwise curing of the backfill material can be done in an environment, such as oxygen, that can inhibit the cure at the surface, thereby increasing the adhesion of the backfill material to a receptor substrate.

In another aspect, a method of making structured solid surfaces is disclosed that includes filling a structured template with backfill material to produce a structured transfer film, patternwise curing the backfill material, laminating the structured transfer film to a receptor substrate, blanket curing the structured transfer film, and removing the structured template layer. In some embodiments, areas of low adhesion can be removed from the receptor substrate along with the structured template layer thereby creating vias.

In this disclosure:

"actinic radiation" refers to wavelengths of radiation that can crosslink or cure polymers and can include ultraviolet, visible, and infrared wavelengths and can include digital exposures from rastered lasers, thermal digital imaging, and electron beam scanning;

"adjacent" refers to layers that are in proximity to each other, usually in contact with each other, but may have an intervening layer between them;

"AMOLED" refers to active matrix organic light-emitting diode;

"hierarchical" refers to constructions that have two or more elements of structure wherein at least one element has nanostructures and at least one element has microstructures. The elements of structure can consist of one, two, three, or more levels of depth. In the disclosed hierarchical constructions nanostructures are always smaller than microstructures;

"land" refers to an unstructured width of area between two adjacent separated microstructural elements;

"LED" refers to a light-emitting diode;

"microstructures" refers to structures that range from about 0.1 μm to about 1000 μm in their longest dimension. In this disclosure, the ranges of nanostructures and microstructures necessarily overlay;

"nanostructures" refers to features that range from about 1 nm to about 1000 nm in their longest dimension;

"planarization materials or layers" refer to layers of materials that fill in irregular surfaces to produce a substantially flat surface that may be used as a base to build additional layered elements;

"structures" refer to features that include microstructures, nanostructures, and/or hierarchical structures; and "vias" refer to voids, holes, or channels with zero land in the patterned backfill layer through which conductive elements, such as electrodes, can be placed.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein:

FIGS. 5 and 5A present a schematic of a flow diagram of a process for making and using a using a disclosed structured tape that has a backfill and postlamination photoexposure using direct write digital exposure.

FIGS. 7 and 7A present a schematic of a flow diagram of a process for making and using a using a disclosed structured tape that has a backfill and a patterned prelamination photoexposure with oxygen surface inhibition.

FIGS. 11a-11b are illustrations that show that the order of photoexposure and lamination are important and can alter the product construction.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
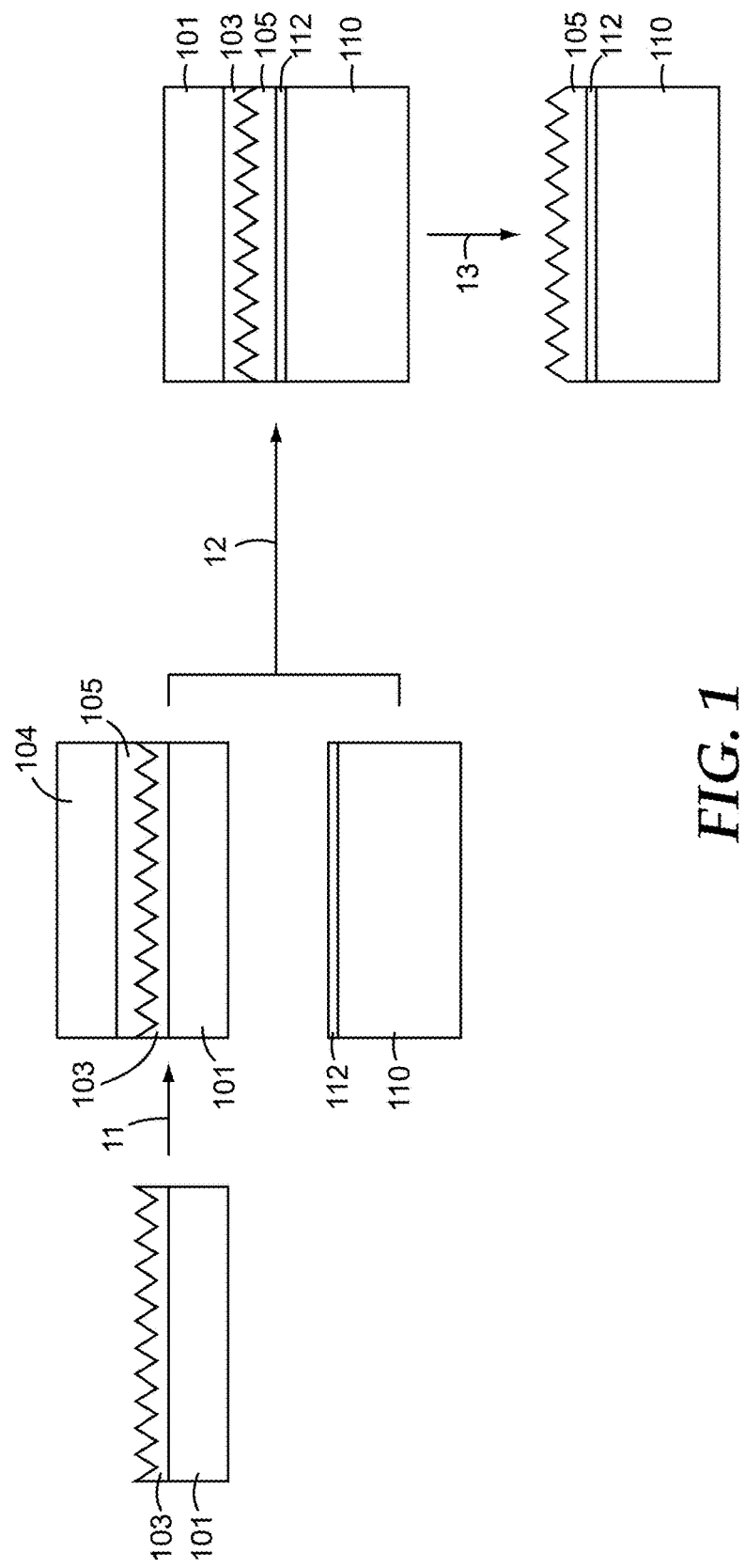
FIG. 1 presents a schematic of a flow diagram of a process of making and using a disclosed structured tape that has a backfill, an adhesion promotion layer, and no patterning.

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Structured lamination transfer films and methods are disclosed that enable the fabrication of structured solid surfaces using lamination. The methods involve replication of a film, layer, or coating in order to form a structured template layer. The replication can be performed against a master using any microreplication techniques known to those of ordinary skill in the art of microreplication. These techniques can include, for example, embossing, cast and cure of a prepolymer resin (using thermal or photochemical initiation), or hot melt extrusion. Typically microreplication involves casting of a photocurable prepolymer solution against a template followed by photopolymerization of the prepolymer solution. In this disclosure, "nanostructured" refers to structures that have features that are less than 1 µm, less than 750 nm, less than 500 nm, less than 250 nm, 100 nm, less than 50 nm, less than 10 nm, or even less than 5 nm. "Microstructured" refers to structures that have features that are less than 1000 µm, less than 100 µm, less than 50 µm, or even less than 5 µm. "Hierarchical" refers to structures with more than one size scale and includes microstructures with nanostructures (e.g. a microlens with nanoscale moth eye antireflection features). Lamination transfer films have been disclosed, for example, in Applicants' pending unpublished application, U.S. patent application Ser. No. 13/553,987, entitled "STRUCTURED LAMINATION TRANSFER FILMS AND METHODS", filed Jul. 20, 2012.

In some embodiments, a photocurable prepolymer solution, typically photocurable upon exposure to actinic radiation (typically ultraviolet radiation) can be cast against a microreplicated master and then exposed to actinic radiation while in contact with the microreplicated master to form the template layer. The photocurable prepolymer solution can be cast onto a carrier film before, during, and even sometimes after, being photopolymerized while in contact with a microreplicated master. The carrier film having the cured microreplicated template layer disposed upon it can be used to produce disclosed patterned structured transfer tapes.

Disclosed patterned structured transfer tapes and methods of making them as well as structures produced by processes utilizing these transfer tapes are illustrated by referencing the figures. FIG. 1 presents a flow diagram of a process of making and using a disclosed structured tape that uses a backfill, an adhesion promotion layer, and no patterning. Structured template layer 103 is disposed upon carrier 101. Structured template layer 103 has a thin layer of release coating (not shown) deposited by, in some cases, plasma enhanced chemical vapor deposition. In some embodiments, release properties may be inherent to the structured template layer. The resulting structure is then coated with uncured backfill layer 105 so that uncured backfill layer 105 completely contacts structured template layer 103 (step 11). The backfill may then be dried, thermally crosslinked, or photocrosslinked to produce a stable intermediate film that, optionally, can be covered with release liner 104 for protection. The structure is then inverted and laminated to receptor substrate 110 coated with adhesion promotion layer 112 (step 12). Adhesion promotion layer 112 is coated uniformly on receptor substrate 110 without patterning. After removal of release coated structured template layer 103 on carrier 101 (step 13), the article includes structured backfill layer 105 adhered to receptor substrate 110 through adhesion promotion layer 112. Optionally, structured backfill layer 105 can then be subjected to further thermal treatment, such as pyrolysis to sinter, cure, or fuse the backfill layer 105 and to vaporize any remaining organic materials.

Figure 2:
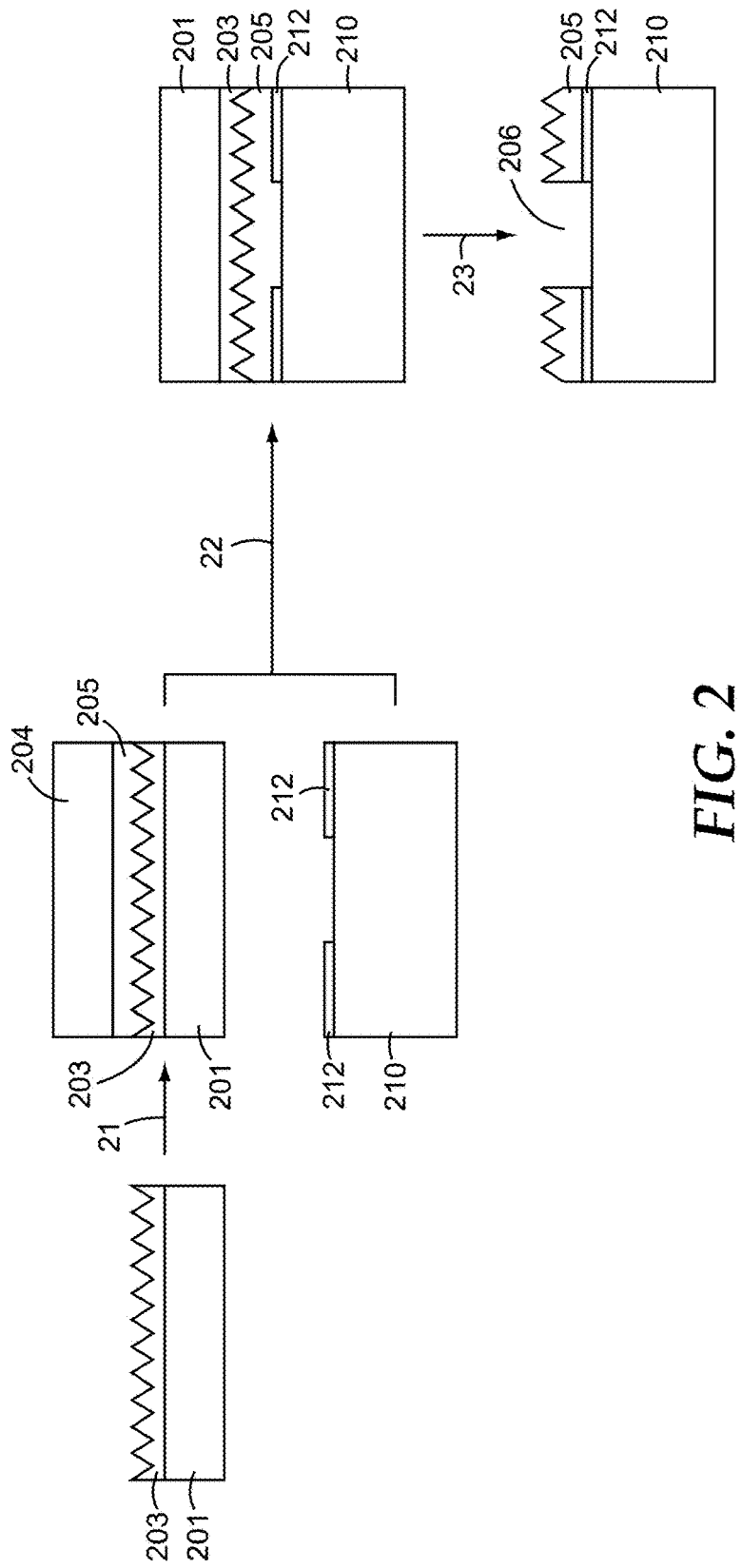
FIG. 2 presents a schematic of a flow diagram of a process for making and using a using a disclosed structured tape that has a backfill and a patterned adhesion promotion layer.

FIG. 2 shows structured template layer 203 disposed upon carrier 201. Structured template layer 203 may have a thin layer of release coating (not shown) deposited by plasma enhanced chemical vapor deposition or other means. The resulting structure is then coated with uncured backfill layer 205 so that uncured backfill layer 205 completely contacts structured template layer 203 (step 21). This stable intermediate film can, optionally, be covered with release liner 204 for protection. The resulting structure is then inverted and laminated to receptor substrate 210 coated with patterned adhesion promotion layer 212 (step 22). Patterned adhesion promotion layer 212 is applied to receptor substrate 210 and patterned via photolithography. After removal of release coated structured template layer 203 on carrier 201 (step 23), the article includes structured uncured backfill layer 205 adhered to receptor substrate 210 through patterned adhesion promotion layer 212. Where there is no patterned adhesion promotion layer 212 (between the patterns) backfill layer 205 adheres to structured template layer 203 and is removed leaving a via or open region. Additionally, the presented method allows for precision alignment between the vias and fiducials or other features on the substrate surface that can be on a receptor substrate.

Figure 3:
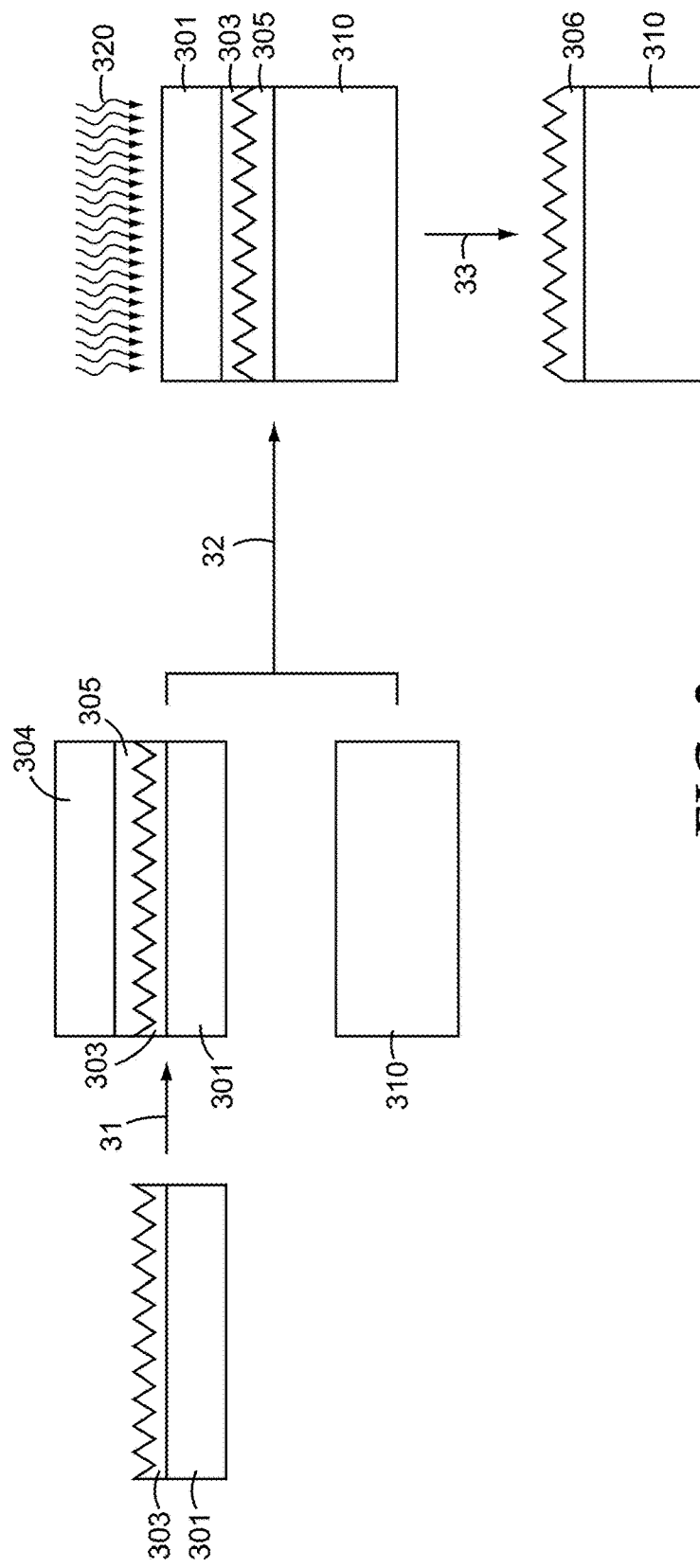
FIG. 3 present a schematic of a flow diagram of a process for making and using a using a disclosed structured tape that has a backfill and a postlamination blanket photocure.

In some embodiments, backfills are tacky at room temperature before photocuring. For example, polyvinyl silsesquioxane as a backfill can be used in disclosed patterned structured transfer tapes without an adhesion promotion layer. FIG. 3 shows structured template layer 303 disposed upon carrier 301. The resulting structure is then coated with uncured backfill layer 305 (step 31). Uncured backfill layer 305 contacts structured template layer 303. A stable intermediate film is produced by laminating of temporary liner 304 to the uncured backfill layer. The liner is removed prior to use of the lamination transfer film. Once the liner is removed, the assembly is then inverted and laminated to receptor substrate 310 without adhesion promotion layer 212 when uncured backfill layer 305 is vinyl silsesquioxane (step 32). The structure is then exposed to blanket ultraviolet radiation 320 to cure structured backfill layer 305 (step 33) and to promote better adhesion to receptor substrate 310. Alternatively, heat may be used to cure the backfill layer. After removal of release coated structured template layer 303 on carrier 301, the article includes structured cured backfill layer 306 disposed upon receptor substrate 310. Optionally, structured cured backfill 306 can then be subjected to further thermal treatment, such as pyrolysis to sinter, cure, or fuse the backfill layer 305 and to vaporize any remaining organic materials.

Figure 4:
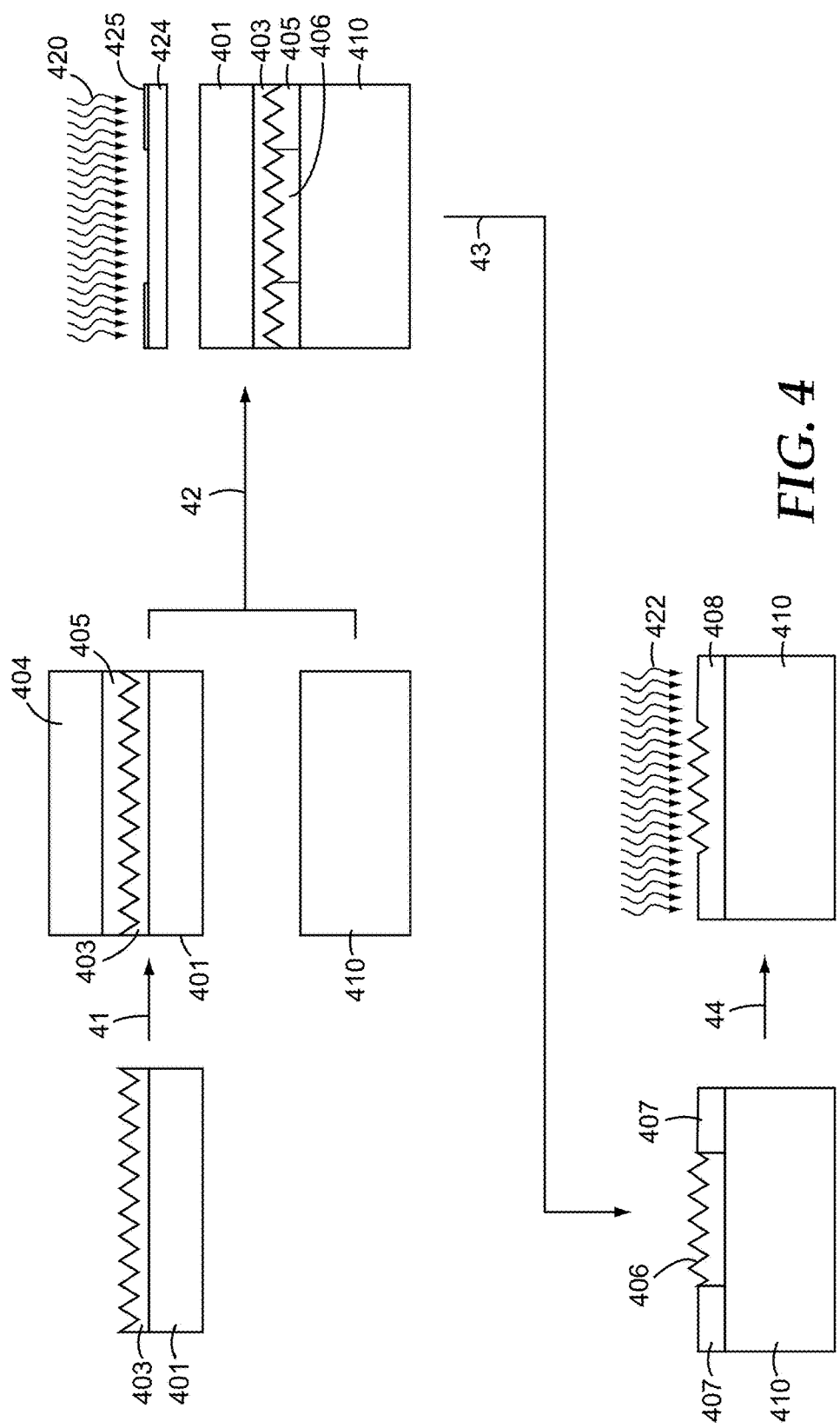
FIG. 4 presents a schematic of a flow diagram of a process for making and using a using a disclosed structured tape that has a backfill and a postlamination photoexposure through a lithographic mask.

Uncured backfill layers can reflow upon template release. An exemplary backfill material that can reflow upon template release is vinyl silsesquioxane. In some embodiments, heat may be employed to enable the reflow of some uncured backfill materials. Patterned and unpatterned areas (due to reflow) can be defined by photocuring through a patterned mask. After removal from the template, the uncured areas of the backflow can reflow to form planarized surfaces, and then a final blanket cure can be used to polymerize the remainder of the uncured areas. FIG. 4 shows structured template layer 403 disposed upon carrier 401. Structured template layer 403 has a thin layer of release coating (not shown) deposited by plasma enhanced chemical vapor deposition. The resulting structure is then coated with uncured backfill layer 405 so that uncured backfill layer 405 completely contacts structured template layer 403 (step 41). A stable intermediate film is produced by laminating temporary liner 404 to the uncured backfill layer. The liner is removed prior to use of the lamination transfer film. Once the liner is removed, the assembly is then inverted and laminated to receptor substrate 410 (step 42). The structure is exposed to first actinic radiation 420 through photomask 425 disposed upon photomask carrier 424. First actinic radiation 420 photopolymerizes backfill 406 where it is not blocked by photomask 425. First actinic radiation 420 cannot penetrate beyond photomask 425 so that backfill layer 405 remains unpolymerized. After removal of release coated structured template layer 403 on carrier 401, the article includes structured cured backfill layer 406 adhered to receptor substrate 410 (step 43). Uncured backfill layer 405 reflows and becomes substantially planarized (unstructured) 407 after removal from contact with template layer. After reflow, photomask 425 is removed and the structure is exposed to blanket actinic radiation, 422, to fully cure the backfill (step 44). Optionally, this structure can then be subjected to further thermal treatment, such as pyrolysis to sinter, cure, or fuse the backfill layer 405 and to vaporize any remaining organic materials.

Figure 5:
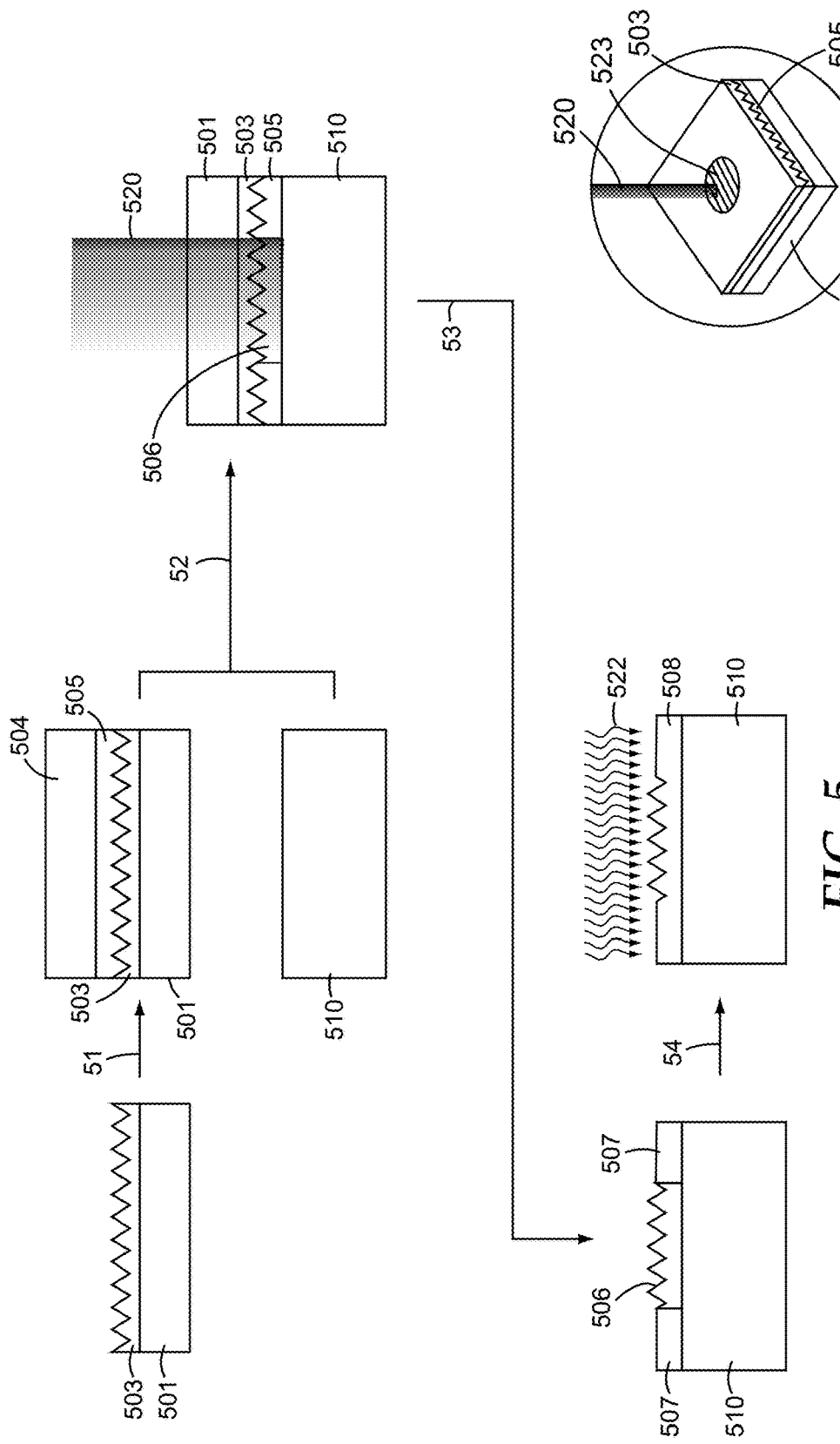

In some embodiments, a digital laser exposure can be used to polymerize selective portions of the backfill layer. FIG. 5 presents a flow diagram of a process for making and using a disclosed structured tape that uses a curable backfill and postlamination first photoexposure using direct write digital laser exposure. FIG. 5 shows structured template layer 503 disposed upon carrier 501. Structured template layer 503 has a thin layer of release coating (not shown) deposited by plasma enhanced chemical vapor deposition or some other means using known coating methods. The resulting structure is then coated with uncured backfill layer 505 so that uncured backfill layer 505 contacts structured template layer 503 (step 51). A stable intermediate film is produced that, optionally, can be laminated with temporary liner 504 for storage and further handling. The liner is removed prior to use of the lamination transfer film. The structure is then inverted and laminated to receptor substrate 510 (step 52). The resulting structure is exposed to a rastered or vector-scanned beam of radiation from first direct write digital laser 520. First direct write digital laser 520 photopolymerizes backfill 506 in the areas exposed to the laser beam. Areas of backfill layer 505 that have not been exposed to the laser beam remain unpolymerized. After removal of release coated structured template layer 503 on carrier 501 (step 53), the article includes structured cured backfill layer 506 adhered to receptor substrate 510. Uncured backfill layer 505 reflows and becomes substantially planarized (unstructured) 507 after removal from contact with template layer. After reflow the structure is exposed to a second actinic radiation 522 to fully cure the backfill 508 (step 54). FIG. 5A illustrates a small volume element showing laser exposed area 523 being polymerized by a beam from first direct write digital laser 520. Optionally, this structure can then be subjected to further thermal treatment, such as pyrolysis to sinter, cure, or fuse the backfill layer 505 and to vaporize any remaining organic materials.

Figure 6:
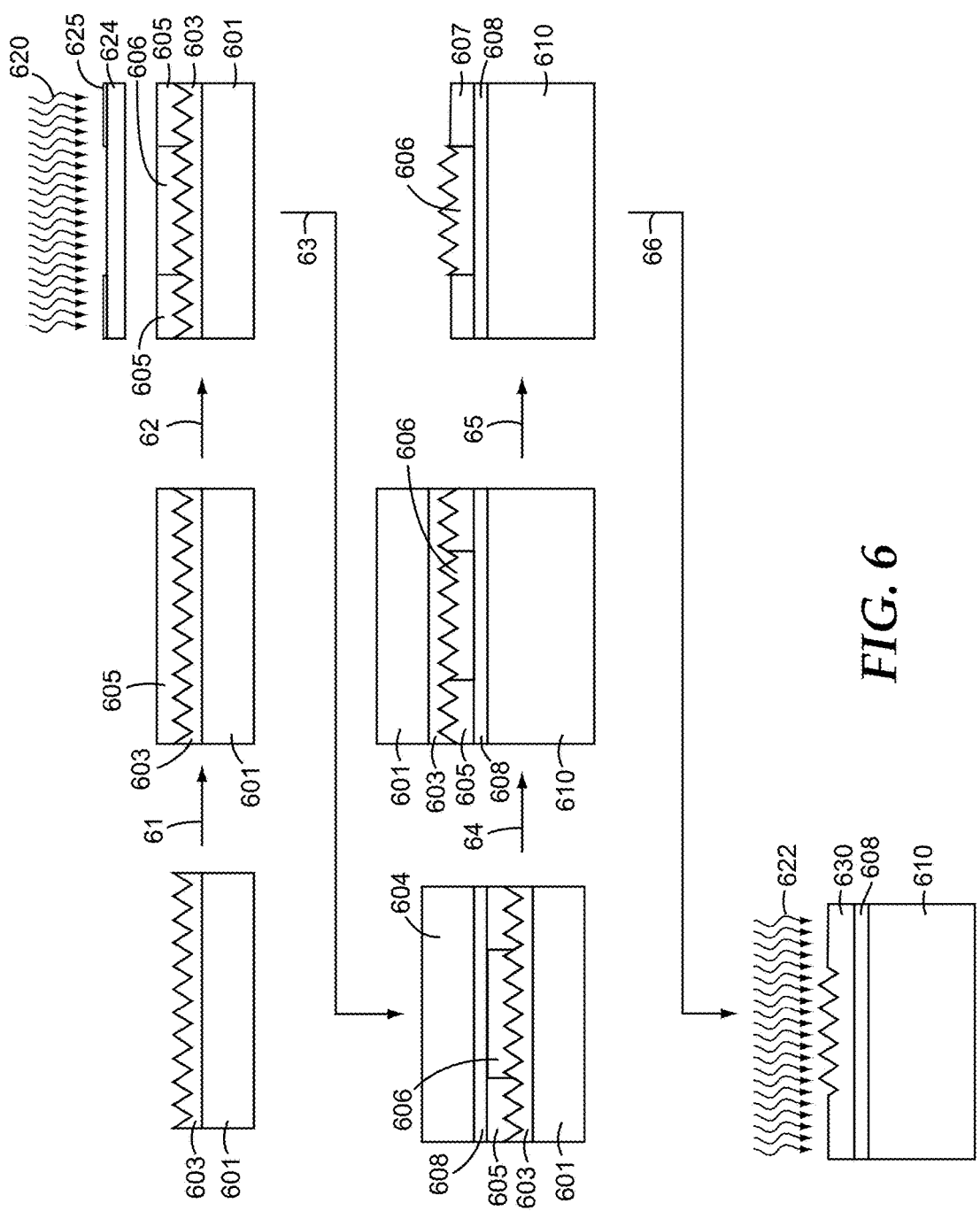
FIG. 6 presents a schematic of a flow diagram of a process for making and using a using a disclosed structured tape that has a backfill, a patterned prelamination photoexposure, and an vinyl silsesquioxane overcoat.

FIG. 6 illustrates a method to manufacture a pre-exposed patterned lamination transfer film. This method may be important for architectural applications such as bird avoidance films and graded daylight redirecting films. Pre-exposed patterned lamination transfer films may be useful in applications in which precise positioning (e.g. alignment to fiducials on a receptor substrate) is not required. FIG. 6 presents a flow diagram of a process for making and using a disclosed structured tape that uses a backfill, a pre-lamination patterned photoexposure, and an adhesion promotion layer. FIG. 6 shows structured template layer 603 disposed upon carrier 601. Structured template layer 603 has a thin layer of release coating (not shown) deposited by plasma enhanced chemical vapor deposition. Alternatively, other method of surface modification or coatings may be used to enhance the release properties of the structured template layer. The resulting structure is then coated with uncured backfill layer 605 (vinyl silsesquioxane) so that uncured backfill layer 605 completely contacts structured template layer 603 (step 61) and forms a stable intermedicae film that can, optionally, be covered with release liner 604 for protection during handling. The structure is exposed to first actinic radiation 620 through photomask 625 disposed upon photomask carrier 624 (step 62). First actinic radiation 620 photopolymerizes backfill 606 where it is not blocked by photomask 625. First actinic radiation 620 cannot penetrate beyond photomask 625 so that backfill 605 remains unpolymerized. The resulting structure after first actinic radiation exposure is then overcoated with adhesion promotion layer 608 which, in some embodiments, can be the same material as backfill 605 (step 63). A stable intermediate film is formed that, optionally, can be covered with temporary liner 604 for storage and future handling. The resulting structure is then inverted and laminated to receptor substrate 610 (step 64). Carrier 601 with release coated template layer 603 is then removed (step 65). Structured and cured backfill 606 then remains structured only in areas that have been exposed to actinic radiation. Unexposed backfill 607 reflows to form areas with unstructured surfaces. The reflow process can occur at room temperature or can be assisted by heat. Finally, the backfill layers (structured and unstructured) as cured by second blanket actinic exposure 622 (step 66). Optionally, this structure can then be subjected to further thermal treatment, such as pyrolysis to sinter, cure, or fuse backfill layer 605 and to vaporize any remaining organic materials.

Figure 7:
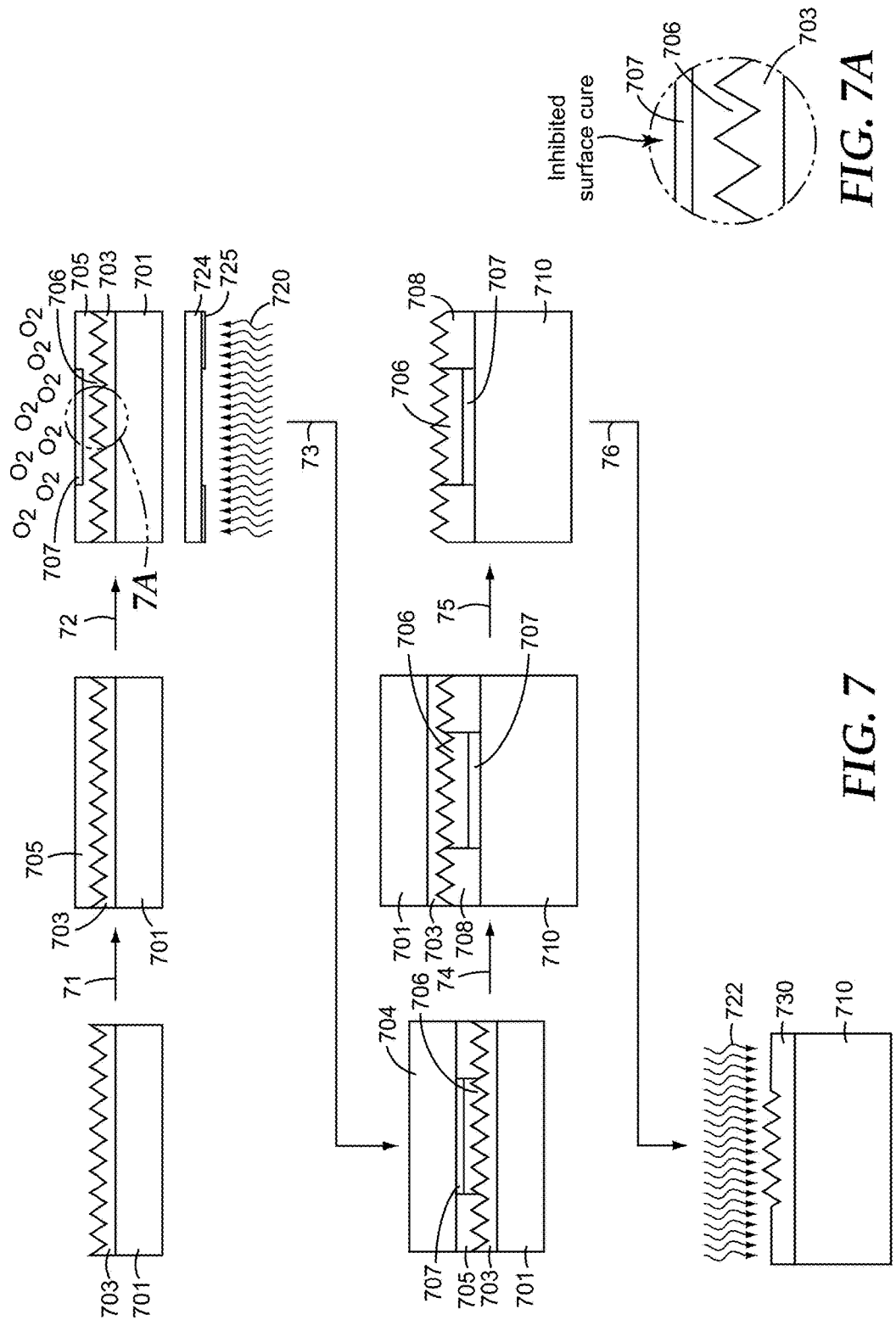

FIG. 7 presents a flow diagram of a process for making and using a disclosed structured tape that uses a backfill and a prelamination photoexposure with oxygen surface inhibition. Inhibiting the surface cure of the backfill layer allows direct lamination to the receptor substrate without need for an adhesion promotion layer as is required in the process illustrated in FIG. 1 or an overcoat as in the process illustrated in FIG. 6. FIG. 7 shows structured template layer 703 disposed upon carrier 701. Structured template layer 703 has a thin layer of release coating (not shown) deposited by plasma enhanced chemical vapor deposition. The resulting structure is then coated with uncured backfill layer 705 so that uncured backfill layer 705 completely contacts structured template layer 703 (step 71). The structure is exposed to first actinic radiation 720 through photomask 725 disposed upon photomask carrier 724 with the top surface of backfill layer 705 exposed to oxygen to inhibit surface curing (step 72). The oxygen inhibits curing at the surface of the backfill layer and produces a gradient of cure from the surface inwards through the bulk of the backfill layer. First actinic radiation 720 photopolymerizes backfill 706 where it is not blocked by photomask 725. First actinic radiation 720 cannot penetrate beyond photomask 725 so that backfill layer 705 remains unpolymerized. The entire air interface of the backfill layer 705/706, remains tacky due to the surface inhibition of curing. Optionally, after curing, the backfill can be covered with temporary release liner 704 for protection during handling (step 73). The resulting structure, with temporary release liner removed, is then inverted and laminated to receptor substrate 710 (step 74). Carrier 701 with release coated template layer 703 is then removed (step 75). Structured and cured backfill 706 then remains only in areas that have been exposed to actinic radiation. Unexposed backfill 708 reflows (step 76) to form an unstructured area. The height of the unstructured area is less than the mean height of any structural elements in the structured transfer tape. Finally, the backfill layers (structured and unstructured) are cured by blanket second actinic radiation exposure 722 (step 76). Optionally, this structure can then be subjected to further thermal treatment, such as pyrolysis to sinter, cure, or fuse the backfill layer 705 and to vaporize any remaining organic materials.

Figure 8:
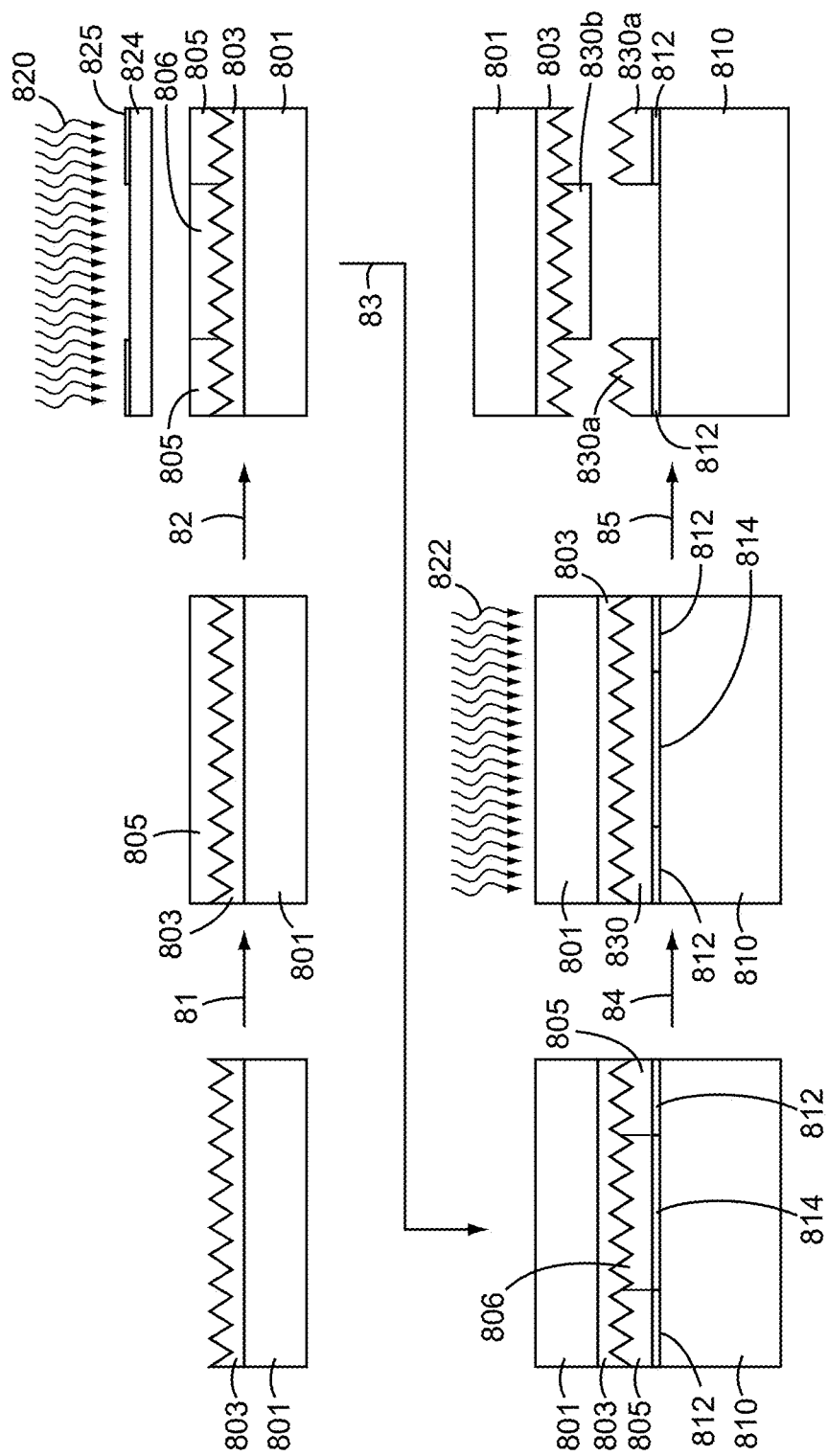
FIG. 8 presents a schematic of a flow diagram of a process for making and using a using a disclosed structured tape that has a backfill, a patterned prelamination photoexposure, and a postlamination photoexposure.

FIG. 8 presents a flow diagram of a process for making and using a disclosed structured tape that uses a backfill and a prelamination photoexposure. FIG. 8 shows structured template layer 803 disposed upon carrier 801. Structured template layer 803 has a thin layer of release coating (not shown) deposited by plasma enhanced chemical vapor deposition. The resulting structure is then coated with uncured backfill layer 805 so that uncured backfill layer 805 completely contacts structured template layer 803 (step 81). The structure is exposed to first actinic radiation 820 through photomask 825 disposed upon photomask carrier 824 (step 82). First actinic radiation 820 photopolymerizes backfill 806 in areas that are not blocked by photomask 825. First actinic radiation 820 cannot penetrate beyond photomask 825 so that backfill 805 remains unpolymerized. Patterned first actinic radiation 820 also leaves "bonding regions" 812 (from uncured backfill 805) at the receptor substrate interface and "non-bonding regions" 814 (from cured patterned backfill 806) at the receptor interface. "Bonding regions" are areas in which the adhesive force between the receptor surface and the backfill is greater than that between the backfill and the structured template (or release layer). In "non-bonding regions", the opposite is true. The location of the "bonding regions" and "non-bonding regions" can be determined by the opaque and transparent features on photomask 825. Optionally, a release liner can be used to protect the exposed structure and to create a stable intermediate for storage or handling. The structure is then inverted and laminated to receptor substrate 810 (step 83). Blanket (unpatterned) second exposure to actinic radiation 822 cures all uncured area of backfill layer 805 (step 84). Release coated structured template layer 803 on carrier 801 can be separated transferring structured backfill layer 830a to receptor substrate 810 in areas of "bonding region" 814 and separating portions of backfill layer 830b that are over non-bonded regions 812 (step 85). The result is that patterned, structured backfill layer 830a has been transferred to receptor substrate 810. The separated structure containing a via can then, optionally, subjected to further thermal treatment, such as pyrolysis to sinter, cure, or fuse the backfill layer 805 and to vaporize any remaining organic materials.

Figure 9:
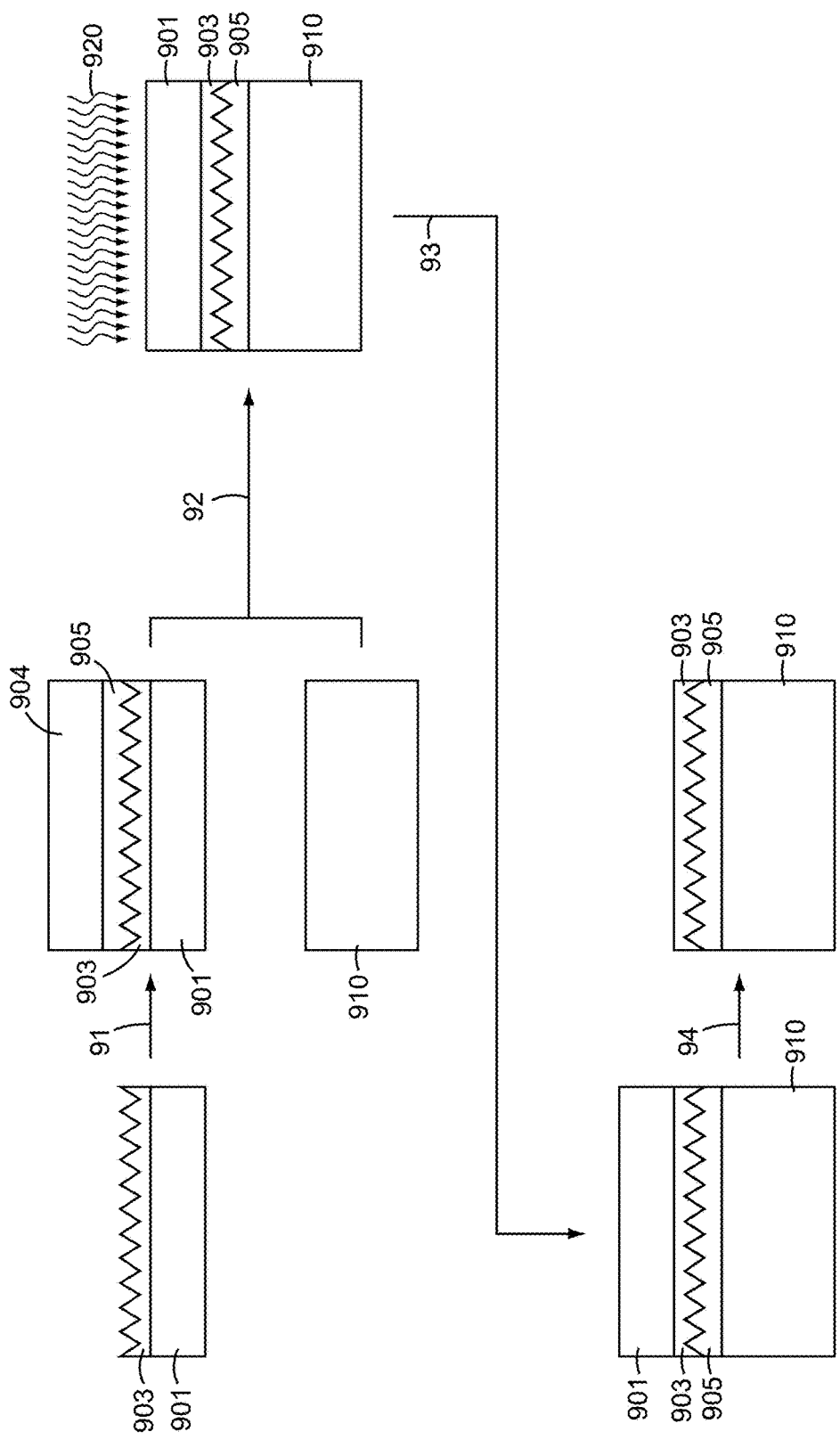
FIGS. 9 and 10 present a flow diagrams of processes for making and using a using a disclosed structured tape that has an embedded backfill with a high index of refraction (FIG. 9) and a low index of refraction (FIG. 10).
Figure 10:
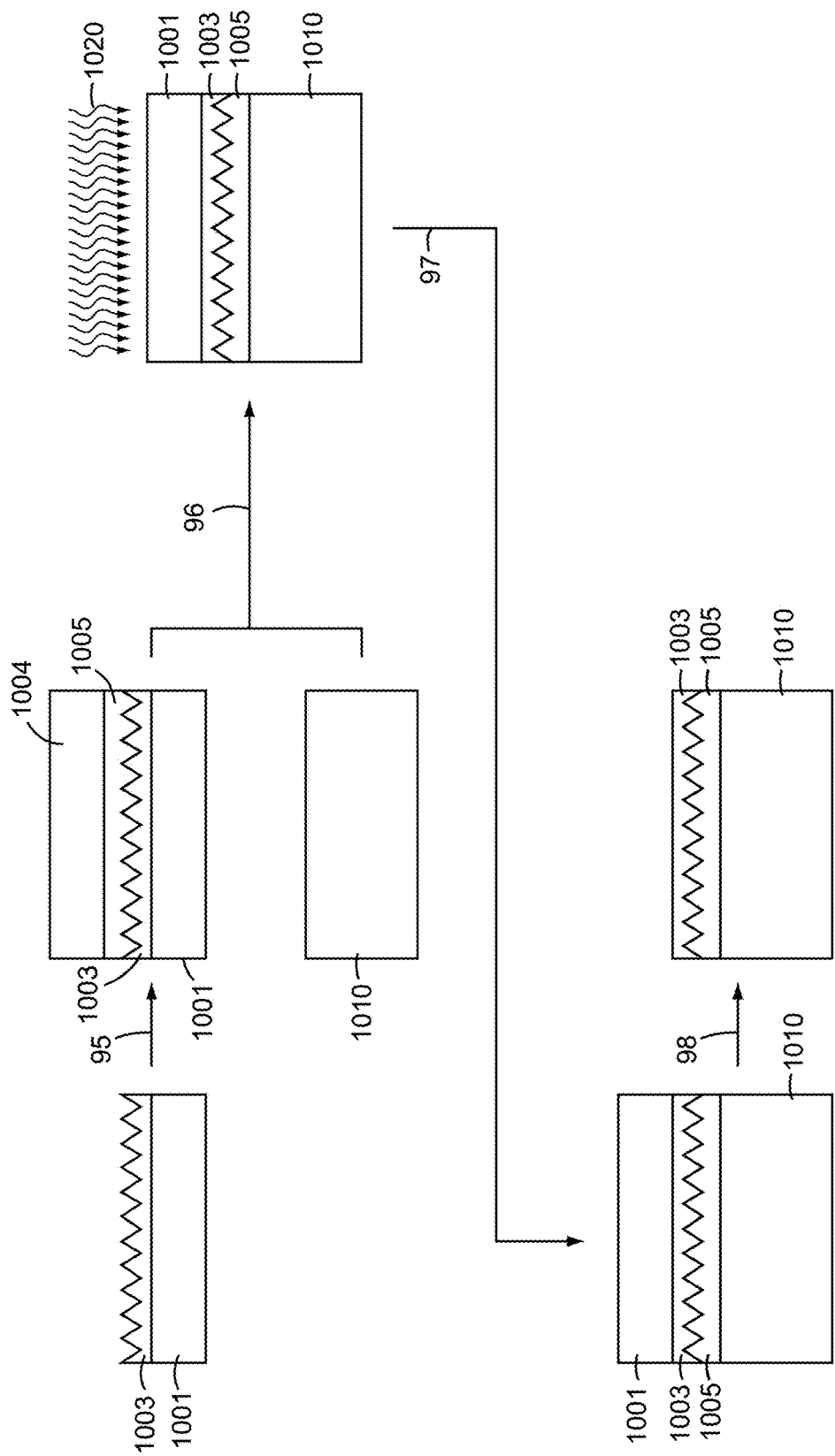

FIGS. 9 and 10 present flow diagrams of processes for making and using a disclosed structured tape that includes a dyad of two transfer layers with refractive indices $n_1$ and $n_2$, where $n_2 > n_1$ and an interlayer interface comprising a micro-, nano- or hierarchical structure. One process can be used to fabricate a dyad on a receptor surface in which the lower refractive index layer is embedded between the receptor and the outer transfer layer (FIG. 9). Another process can be used to fabricate a dyad on a receptor surface in which the higher refractive index layer is embedded (FIG. 10). FIG. 9 illustrates a method for making an embedded structure with a first dyad layer having an index of refraction n~1.5 or greater, typically around 1.55 and a second dyad layer, with n~1.8, adjacent to the first dyad layer, so that the embedded structure, when transferred to a receptor substrate such as glass (n~1.5) has a similar index of refraction to that of the receptor substrate. In this configuration the dyad can serve as an extraction interface between the receptor substrate (glass) and a transparent conductor such as indium-tin-oxide (n around 1.8). During the illustrated process a dyad of layers (structured template layer and structured backfill layer) is transferred to a receptor substrate as a single unit. The process illustrated in FIG. 9 can be combined with patterning methods previously illustrated (see, for example, FIG. 8 that can create vias on an AMOLED backplane). FIG. 9 shows structured template layer 903 disposed upon carrier 901. Structured template layer 903 has a higher index of refraction (typically n≥1.55, and more typically around 1.8). The structure is then coated with uncured backfill layer 905 having a lower index of refraction (less than the index of refraction of structured template layer 903 and typically n≤1.55) (step 91). Uncured backfill layer 905 completely contacts structured template layer 903. Optionally, the backfill can be covered with release liner 904 for protection during handling. The structure is then inverted and laminated to receptor substrate 910 without an adhesion promotion layer when uncured backfill layer is tacky before cure (step 92). The structure is then exposed to blanket actinic radiation 920 to cure structured backfill layer 905 to give the structure (step 93). After removal of carrier 901, an article is obtained that includes structured cured backfill layer 905 having a lower index of refraction disposed upon structured template layer having a higher index of refraction in contact with receptor substrate 910 (step 94).

FIG. 10 illustrates a method for making an embedded structure with a higher index of refraction n≥1.5, typically around 1.8. The process illustrated in these figures can be useful for embedded diffractive or refractive optical elements as well as decorative surface effects on high index glass or crystal. Embedding the optical structure in this manner improves the durability and of the element and protects it from contamination with dirt, dust, debris, or skin oil. During the illustrated process a dyad of layers (structured template layer and structured backfill layer) is transferred to a receptor substrate. FIG. 10 shows structured template layer 1003 disposed upon carrier 1001. Structured template layer 1003 has a relatively low index of refraction compared with the backfill layer. The resulting structure is then coated with uncured backfill layer 1005 having a high index of refraction (higher than the index of refraction of structured template layer 1003 and typically n≤1.5) (step 95). Uncured backfill layer 1005 completely contacts structured template layer 1003. Optionally, the backfill can be covered with release liner 1004 for protection during handling. The structure is then inverted and laminated to receptor substrate 1010 without an adhesion promotion layer when uncured backfill layer is tacky before cure (step 96). The structure is then exposed to actinic radiation or thermal 1020 to cure the structured backfill layer 1005 (step 97). After removal of carrier 1001, an article is obtained that includes structured cured backfill layer 1005 having a high index of refraction disposed upon structured template layer having a high index of refraction in contact with receptor substrate 1010 (step 98).

FIG. 11 is an illustration that shows that the order of photoexposure and steps can determine the result of the lamination transfer resulting in a great degree of control over the process. The upper scheme in FIG. 11 generally follows the process presented in FIG. 8. Exposure to actinic radiation, then lamination, results in a patterned area with a via in the exposed region. Reversing the steps, the lower scheme in FIG. 11 leads to lamination transfer over the entire area with patterning in the exposed regions only, and generally follows the process presented in FIG. 4. The result can be controlled and can yield one structure with actinic patterned curing then lamination (FIG. 11a) or a different structure with lamination followed by patterned curing with actinic radiation. (FIG. 11b).

Applications of Lamination Transfer Films

The lamination transfer films disclosed herein can be used for patterning of digital optical elements including microfresnel lenses, diffractive optical elements, holographic optical elements, and other digital optics disclosed in Chapter 2 of B. C. Kress, and P. Meyrueis, *Applied Digital Optics*, Wiley, 2009, on either the internal or external surfaces of display glass, photovoltaic glass elements, LED wafers, silicon wafers, sapphire wafers, architectural glass, metal foil, metal sheet, nonwovens, paper, or other substrates such as polymers or ceramics.

The lamination transfer films can also be used to produce decorative effects on glass surfaces. For example, it might be desirable to impart iridescence to the surface of a decorative crystal facet. In particular, the glass structures can be used in either functional or decorative applications such as transportation glasses, architectural glasses, glass tableware, artwork, display signage, and jewelry or other accessories. Durability of the glass structures may be improved by using the methods disclosed herein to transfer embedded structures. Also, a coating can be applied over these glass structures. This optional coating can be relatively thin in order to avoid adversely affecting the glass structure properties. Examples of such coatings include hydrophilic coatings, hydrophobic coatings, protective coatings, anti-reflection coatings and the like.

Materials

Six main classes of materials are required for the fabrication of the structured transfer films for the patterning of solid optical surfaces: carrier films, receptor substrates, template layer, release layer, backfill and planarization materials of tunable refractive index, and liners to protect the backfill layer after manufacture before lamination.

Carrier Films

The liner or carrier substrate can be implemented with a flexible film providing mechanical support for the other layers. One example of a carrier film is polyethylene terephthalate (PET). In some embodiments, the carrier can include paper, release-coated paper, non-wovens, wovens (fabric), metal films, and metal foils.

Various polymeric film substrates comprised of various thermosetting or thermoplastic polymers are suitable for use as the carrier. The carrier may be a single layer or multi-layer film. Illustrative examples of polymers that may be employed as the carrier layer film include (1) fluorinated polymers such as poly(chlorotrifluoroethylene), poly(tetrafluoroethylene-cohexafluoropropylene), poly(tetrafluoroethylene-co-perfluoro(alkyl)vinylether), poly(vinylidene fluoride-cohexafluoropropylene); (2) ionomeric ethylene copolymers poly(ethylene-co-methacrylic acid) with sodium or zinc ions such as SURLYN-8920 Brand and SURLYN-9910 Brand available from E. I. duPont Nemours, Wilmington, Del.; (3) low density polyethylenes such as low density polyethylene; linear low density polyethylene; and very low density polyethylene; plasticized vinyl halide polymers such as plasticized poly(vinylchloride); (4) polyethylene copolymers including acid functional polymers such as poly(ethylene-co-acrylic acid) "EAA", poly(ethylene-co-methacrylic acid) "EMA", poly(ethylene-co-maleic acid), and poly(ethylene-co-fumaric acid); acrylic functional polymers such as poly(ethylene-co-alkylacrylates) where the alkyl group is methyl, ethyl, propyl, butyl, et cetera, or CH3(CH2)n- where n is 0 to 12, and poly(ethylene-co-vinylacetate) "EVA"; and (5) (e.g.) aliphatic polyurethanes. The carrier layer is typically an olefinic polymeric material, typically comprising at least 50 wt-% of an alkylene having 2 to 8 carbon atoms with ethylene and propylene being most commonly employed. Other body layers include for example poly(ethylene naphthalate), polycarbonate, poly(meth)acrylate (e.g., polymethyl methacrylate or "PMMA"), polyolefins (e.g., polypropylene or "PP"), polyesters (e.g., polyethylene terephthalate or "PET"), polyamides, polyimides, phenolic resins, cellulose diacetate, cellulose triacetate (TAC), polystyrene, styrene-acrylonitrile copolymers, cyclic olefin copolymers, epoxies, and the like.

Receptor Substrates

Examples of receptor substrates include glass such as display mother glass, lighting mother glass, architectural glass, plate glass, roll glass, and flexible glass (can be used in roll to roll processes). An example of flexible roll glass is the WILLOW glass product from Corning Incorporated. Other examples of receptor substrates includes metals such as metal sheets and foils. Yet other examples of receptor substrates include sapphire, silicon, silica, and silicon carbide. Yet another example includes fabric, nonwovens, and papers.

Other exemplary receptor substrates include semiconductor materials on a support wafer. The dimensions of these receptor substrates can exceed those of a semiconductor wafer master template. Currently, the largest wafers in production have a diameter of 300 mm. Lamination transfer films produced using the method disclosed herein can be made with a lateral dimension of greater than 1000 mm and a roll length of hundreds of meters. In some embodiments, the receptor substrates can have dimensions of about 620 mm×about 750 mm, of about 680 mm×about 880 mm, of about 1100 mm×about 1300 mm, of about 1300 mm×about 1500 mm, of about 1500 mm×about 1850 mm, of about 1950 mm×about 2250 mm, or about 2200 mm×about 2500 mm, or even larger. For long roll lengths, the lateral dimensions can be greater than about 750 mm, greater than about 880 mm, greater than about 1300 mm, greater than about 1500 mm, greater than about 1850 mm, greater than about 2250 nm, or even greater than about 2500 mm. Typical dimensions have a maximum patterned width of about 1400 mm and a minimum width of about 300 mm. The large dimensions are possible by using a combination of roll-to-roll processing and a cylindrical master template. Films with these dimensions can be used to impart nanostructures over entire large digital displays (e.g., a 55 inch diagonal display, with dimensions of 52 inches wide by 31.4 inches tall).

The receptor substrate can optionally include a buffer layer on a side of the receptor substrate to which a lamination transfer film is applied. Examples of buffer layers are disclosed in U.S. Pat. No. 6,396,079 (Hayashi et al.), which is incorporated herein by reference as if fully set forth. One type of buffer layer is a thin layer of $SiO_2$, as disclosed in K. Kondoh et al., *J. of Non-Crystalline Solids* 178 (1994) 189-98 and T-K. Kim et al., *Mat. Res. Soc. Symp. Proc.* Vol. 448 (1997) 419-23.

A particular advantage of the transfer process disclosed herein is the ability to impart structure to receptor surfaces with large surfaces, such as display mother glass or architectural glass. The dimensions of these receptor substrates exceed those of a semiconductor wafer master template. The large dimensions of the lamination transfer films are possible by using a combination of roll-to-roll processing and a cylindrical master template.

An additional advantage of the transfer process disclosed herein is the ability to impart structure to receptor surface that are not planar. The receptor substrate can be curved, bent twisted, or have concave or convex features, due to the flexible format of the transfer tape.

Receptor substrates also may include, automotive glass, sheet glass, flexible electronic substrates such as circuitized flexible film, display backplanes, solar glass, metal, polymers, polymer composites, and fiberglass.

Template Layer

The template layer is the layer that imparts the structure to the backfill layer. It is made up of template materials. The template layer can be formed through embossing, replication processes, extrusion, casting, or surface structuring, for example. The structured surface can include nanostructures, microstructures, or hierarchical structures. Nanostructures comprise features having at least one dimension (e.g., height, width, or length) less than or equal to one micron. Microstructures comprise features having at least one dimension (e.g., height, width, or length) less than or equal to one millimeter. Hierarchical structures are combinations of nanostructures and microstructures. In some embodiments, the template layer can be compatible with patterning, actinic patterning, embossing, extruding, and coextruding.

Typically, the template layer includes a photocurable material that can have a low viscosity during the replication process and then can be quickly cured to form a permanent crosslinked polymeric network "locking in" the replicated nanostructures, microstructures or hierarchical structures. Any photocurable resins known to those of ordinary skill in the art of photopolymerization can be used for the template layer. The resin used for the template layer must be capable, when crosslinked, of releasing from the backfill layer during the use of the disclosed structured tapes, or should be compatible with application of a release layer (see below) and the process for applying the release layer. Additionally, the resins used for the template layer must be compatible with the application of an adhesion promotion layer as discussed above.

Polymers that can be used as the template layer also include the following: styrene acrylonitrile copolymers; styrene(meth)acrylate copolymers; polymethylmethacrylate; polycarbonate; styrene maleic anhydride copolymers; nucleated semi-crystalline polyesters; copolymers of polyethylenenaphthalate; polyimides; polyimide copolymers; polyetherimide; polystyrenes; syndiodactic polystyrene; polyphenylene oxides; cyclic olefin polymers; and copolymers of acrylonitrile, butadiene, and styrene. One preferable polymer is the Lustran SAN Sparkle material available from Ineos ABS (USA) Corporation. Polymers for radiation cured template layers include cross linked acrylates such as multifunctional acrylates or epoxies and acrylated urethanes blended with mono- and multifunctional monomers.

Patterned structured template layers can be formed by depositing a layer of a radiation curable composition onto one surface of a radiation transmissive carrier to provide a layer having an exposed surface, contacting a master with a preformed surface bearing a pattern capable of imparting a three-dimensional microstructure of precisely shaped and located interactive functional discontinuities including distal surface portions and adjacent depressed surface portions into the exposed surface of the layer of radiation curable composition on said carrier under sufficient contact pressure to impart said pattern into said layer, exposing said curable composition to a sufficient level of radiation through the carrier to cure said composition while the layer of radiation curable composition is in contact with the patterned surface of the master. This cast and cure process can be done in a continuous manner using a roll of carrier, depositing a layer of curable material onto the carrier, laminating the curable material against a master and curing the curable material using actinic radiation. The resulting roll of carrier with a patterned, structured template disposed thereon can then be rolled up. This method is disclosed, for example, in U.S. Pat. No. 6,858,253 (Williams et al.).

For extrusion or embossed template layers, the materials making up the template layer can be selected depending on the particular topography of the top structured surface that is to be imparted. In general, the materials are selected such that the structure is fully replicated before the materials solidify. This will depend in part on the temperature at which the material is held during the extrusion process and the temperature of the tool used to impart the top structured surface, as well as on the speed at which extrusion is being carried out. Typically, the extrudable polymer used in the top layer has a $T_g$ of less than about 140° C., or a $T_g$ of from about 85° C. to about 120° C., in order to be amenable to extrusion replication and embossing under most operating conditions. In some embodiments, the carrier film and the template layer can be coextruded at the same time. This embodiment requires at least two layers of coextrusion—a top layer with one polymer and a bottom layer with another polymer. If the top layer comprises a first extrudable polymer, then the first extrudable polymer can have a $T_g$ of less than about 140° C. or a $T_g$ or of from about 85° C. to about 120° C. If the top layer comprises a second extrudable polymer, then the second extrudable polymer, which can function as the carrier layer, has a $T_g$ of less than about 140° C. or a $T_g$ of from about 85° C. to about 120° C. Other properties such as molecular weight and melt viscosity should also be considered and will depend upon the particular polymer or polymers used. The materials used in the template layer should also be selected so that they provide good adhesion to the carrier so that delamination of the two layers is minimized during the lifetime of the optical article.

The extruded or coextruded template layer can be cast onto a master roll that can impart patterned structure to the template layer. This can be done batchwise or in a continuous roll-to-roll process. Additionally, a backfill layer can be extruded onto the extruded or coextruded template layer. In some embodiments, all three layers—carrier, template, and backfill layers can be coextruded at once as long as the backfill layer can be separated from the template layer after processing.

Useful polymers that may be used as the template layer polymer include one or more polymers selected from the group consisting of styrene acrylonitrile copolymers; styrene (meth)acrylate copolymers; polymethylmethacrylate; styrene maleic anhydride copolymers; nucleated semi-crystalline polyesters; copolymers of polyethylenenaphthalate; polyimides; polyimide copolymers; polyetherimide; polystyrenes; syndiodactic polystyrene; polyphenylene oxides; and copolymers of acrylonitrile, butadiene, and styrene.

Particularly useful polymers that may be used as the first extrudable polymer include styrene acrylonitrile copolymers known as TYRIL copolymers available from Dow Chemical; examples include TYRIL 880 and 125. Other particularly useful polymers that may be used as the template polymer include styrene maleic anhydride copolymer DYLARK 332 and styrene acrylate copolymer NAS 30, both from Nova Chemical. Also useful are polyethylene terephthalate blended with nucleating agents such as magnesium silicate, sodium acetate, or methylenebis(2,4-di-t-butylphenol) acid sodium phosphate.

Exemplary polymers with high refractive indices useful as the top skin layer include CoPENs (copolymers of polyethylenenaphthalate), CoPVN (copolymers of polyvinylnaphthalene) and polyimides including polyetherimide. Suitable resin compositions include transparent materials that are dimensionally stable, durable, weatherable, and readily formable into the desired configuration. Examples of suitable materials include acrylics, which have an index of refraction of about 1.5, such as PLEXIGLAS brand resin manufactured by Rohm and Haas Company; polycarbonates, which have an index of refraction of about 1.59; reactive materials such as thermoset acrylates and epoxy acrylates; polyethylene based ionomers, such as those marketed under the brand name of SURLYN by E. I. Dupont de Nemours and Co., Inc.; (poly)ethylene-co-acrylic acid; polyesters; polyurethanes; and cellulose acetate butyrates. The template layer may be prepared by casting directly onto a carrier film, such as disclosed in U.S. Pat. No. 5,691,846 (Benson). Polymers for radiation cured structures include cross linked acrylates such as multifunctional acrylates or epoxies and acrylated urethanes blended with mono- and multifunctional monomers.

The template layer may be sacrificial meaning that it will be removed from the construction at a later time as is the template layer disclosed in Applicants' pending unpublished application, U.S. patent application Ser. No. 13/553,987, entitled "STRUCTURED LAMINATION TRANSFER FILMS AND METHODS", filed Jul. 20, 2012. However, the method for making the disclosed transfer tapes and articles made therefrom do not require that the template layer be sacrificial.

Release Layer

The template layer must be removed from the backfill layer. One method to reduce the adhesion of the backfill layer to the template layer is to apply a release coating to the film. One method of applying a release coating to the surface of the template layer is with plasma deposition. An oligomer can be used to create a plasma cross-linked release coating. The oligomer may be in liquid or in solid form prior to coating. Typically the oligomer has a molecular weight greater than 1000. Also, the oligomer typically has a molecular weight less than 10,000 so that the oligomer is not too volatile. An oligomer with a molecular weight greater than 10,000 typically may be too non-volatile, causing droplets to form during coating. In one embodiment, the oligomer has a molecular weight greater than 3000 and less than 7000. In another embodiment, the oligomer has a molecular weight greater than 3500 and less than 5500. Typically, the oligomer has the properties of providing a low-friction surface coating. Suitable oligomers include silicone-containing hydrocarbons, reactive silicone containing trialkoxysilanes, aromatic and aliphatic hydrocarbons, fluorochemicals and combinations thereof. For examples, suitable resins include, but are not limited to, dimethylsilicone, hydrocarbon based polyether, fluorochemical polyether, ethylene tetrafluoroethylene, and fluorosilicones.

Fluorosilane surface chemistry, vacuum deposition, and surface fluorination may also be used to provide a release coating.

Plasma polymerized thin films constitute a separate class of material from conventional polymers. In plasma polymers, the polymerization is random, the degree of crosslinking is extremely high, and the resulting polymer film is very different from the corresponding "conventional" polymer film. Thus, plasma polymers are considered by those skilled in the art to be a uniquely different class of materials and are useful in the disclosed articles.

In addition, there are other ways to apply release coatings to the template layer, including, but not limited to, blooming, coating, coextrusion, spray coating, electrocoating, or dip coating.

Backfill and Planarization Materials

The backfill layer is a material capable of substantially planarizing the adjacent layer (e.g., the template layer) while also conforming to the surface of the receptor layer. The backfill layer can alternatively be a bilayer of two different materials where the bilayer has a multi-layer structure or where one of the materials is at least partially embedded in the other material. The two materials for the bilayer can optionally have different indices of refraction. One of the bilayers can optionally comprise an adhesion promoting layer.

Substantial planarization means that the amount of planarization (P %), as defined by Equation (1), is preferably greater than 50%, more preferably greater than 75%, and most preferably greater than 90%.

$$P\% = (1 - (t_1/h_1))*100 \qquad \text{Equation (1)}$$

where $t_1$ is the relief height of a surface layer and $h_1$ is the feature height of features covered by the surface layer, as further disclosed in P. Chiniwalla, *IEEE Trans. Adv. Packaging* 24(1), 2001, 41.

Materials that may be used for the backfill include polysiloxane resins, polysilazanes, polyimides, silsesquioxanes of bridge or ladder-type, silicones, and silicone hybrid materials and many others. Exemplary polysiloxane resins include PERMANEW 6000 L510-1, available from California Hardcoat, Chula Vista, Calif. These molecules typically have an inorganic core which leads to high dimensional stability, mechanical strength, and chemical resistance, and an organic shell that helps with solubility and reactivity. There are many commercial sources of these materials, which are summarized in Table 2 below. Other classes of materials that may be of use are benzocyclobutenes, soluble polyimides, and polysilazane resins, for example.

Materials useful for the backfill layer can include vinyl silsesquioxanes; sol gel materials; silsesquioxanes; nanoparticle composites including those that include nanowires; quantum dots; nanorods; abrasives; metal nanoparticles; sinterable metal powders; carbon composites comprising graphene, carbon nanotubes, and fullerenes; conductive composites; inherently conductive (conjugated) polymers; electrically active materials (anodic, cathodic, etc.); composites comprising catalysts; low surface energy materials; and fluorinated polymers or composites.

The backfill layer can comprise any material as long as it has the desired rheological and physical properties discussed previously. Typically, the backfill layer is made from a polymerizable composition comprising monomers which are cured using actinic radiation, e.g., visible light, ultraviolet radiation, electron beam radiation, heat and combinations thereof. Any of a variety of polymerization techniques, such as anionic, cationic, free radical, condensation or others may be used, and these reactions may be catalyzed using photo, photochemical or thermal initiation. These initiation strategies may impose thickness restrictions on the backfill layer, i.e the photo or thermal trigger must be able to uniformly react throughout the entire film volume. Useful polymerizable compositions comprise functional groups known in the art, such as epoxide, episulfide, vinyl, hydroxyl, allyloxy, (meth)acrylate, isocyanate, cyanoester, acetoxy, (meth)acrylamide, thiol, silanol, carboxylic acid, amino, vinyl ether, phenolic, aldehyde, alkyl halide, cinnamate, azide, aziridine, alkene, carbamates, imide, amide, alkyne, and any derivatives or combinations of these groups. The monomers used to prepare the backfill layer can comprise polymerizable oligomers or copolymers of any suitable molecular weight such as urethane (meth)acrylates, epoxy (meth)acrylates, polyester (meth)acrylates) and the like. The reactions generally lead to the formation of a three-dimensional macromolecular network and are known in the art as negative-tone photoresists, as reviewed by Shaw et al., "Negative photoresists for optical lithography", *IBM Journal of Research and Development* (1997) 41, 81-94. The formation of the network may occur through either through covalent, ionic, or hydrogen bonding or through physical crosslinking mechanisms such as chain entanglement. The reactions can also be initiated through one or more intermediate species, such as free-radical initiators, photosensitizers, photoacid generators, photobase generators, or thermal acid generators. Other molecular species may be involved in network formation as well, such as crosslinker molecules containing two or more functional groups known in the art to be reactive with the previously mentioned molecular species.

Reinforced silicone polymers can be used for the backfill layer, due to their high chemical stability and excellent adhesion to glass. Therefore, no adhesion promotion layer is necessary for adhesion to glass substrates. Silicones are also well known not to adhere to other polymers, which makes this material straightforward to release from microstructured polymer tools, but difficult to transfer as one component in a dyad, unless the other component is also a silicone. One such silicone formulation, used in Example 4, is known as SYLGARD 184 (Dow Corning, Midland, Mich.), which is a 2-component mixture of polydimethylsiloxane and vinylsiloxane mixed with hydrosiloxane and a platinum catalyst. Slight heating of this mixture causes the silicone network to form via platinum-catalyzed hydrosilylation curing reaction. Other silicones and catalysts can be used to the same effect, as demonstrated in Example 5. Gelest Inc. (Morrisville, Pa.) manufactures a wide variety of siloxanes functionalized with various reactive groups (epoxy, carbinol, mercapto, methacryloxy amino, silanol) for example. Gelest also sells these siloxanes pre-compounded with various additives, such as fully condensed silica nanoparticles or MQ resins, to tune the mechanical properties of the silicone network. Other platinum catalysts can also be used, such as (trimethyl) methyl cyclopentadenyl platinum (IV) (Strem Chemicals Inc., Newburyport, Mass.), which activates via ultraviolet radiation but still requires a subsequent thermal cure. Photocurable silicone systems are advantageous because as long as they are kept in the dark, their viscosity decreases with increasing temperature, allowing bubbles to escape and better penetration into nanostructured tools.

Different varieties of the above materials can be synthesized with higher refractive index by incorporating nanoparticles or metal oxide precursors in with the polymer resin. Silecs SC850 material is a modified silsesquioxane (n≈1.85) and Brewer Science high index polyimide OptiNDEX D1 material (n≈1.8) are examples in this category. Other materials include a copolymer of methyltrimethoxysilane (MTMS) and bistriethoxysilylethane (BTSE) (Ro et. al, *Adv. Mater.* 2007, 19, 705-710). This synthesis forms readily soluble polymers with very small, bridged cyclic cages of silsesquioxane. This flexible structure leads to increased packing density and mechanical strength of the coating. The ratio of these copolymers can be tuned for very low coefficient of thermal expansion, low porosity and high modulus.

In some embodiments, the backfill layer can include polyvinyl silsesquioxane polymers. These polymers can be prepared by the hydrolysis of vinyltriethoxysilane

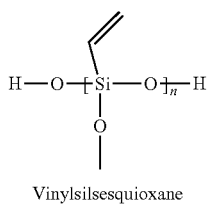

(I)

Vinylsilsesquioxane

Upon polymerization, typically by the addition of a photoinitiator followed by exposure to ultraviolet radiation, a three dimensional network is formed by free radical polymerization of the many vinyl groups.

The backfill material typically can meet several requirements. First, it can adhere and conform to the structured surface of the template layer on which it is coated. This means that the viscosity of the coating solution should be low enough to be able to flow into very small features without the entrapment of air bubbles, which will lead to good fidelity of the replicated structure. If it is solvent based, it should be coated from a solvent that does not dissolve or swell the underlying template layer, which would cause cracking or swelling of the backfill. It is desirable that the solvent has a boiling point below that of the template layer glass transition temperature. Preferably, isopropanol, butyl alcohol and other alcoholic solvents have been used. Second, the material should cure with sufficient mechanical integrity (e.g., "green strength"). If the backfill material does not have enough green strength after curing, the backfill pattern features will slump and replication fidelity will degrade. Third, for some embodiments, the refractive index of the cured material should be tailored to produce the proper optical effect. Other substrates of a different refractive index can also be used for this process, such as sapphire, nitride, metal, polyimide, or oxide. Fourth, the backfill material should be thermally stable (e.g., showing minimal cracking, blistering, or popping) above the temperature of the upper range of the future process steps of the substrate. Typically the materials used for this layer undergo a condensation curing step, which causes shrinkage and the build-up of compressive stresses within the coating. There are a few materials strategies which are used to minimize the formation of these residual stresses which have been put to use in several commercial coatings which satisfy all of the above criteria.

It can be advantageous to adjust the refractive index of both the backfill and planarization layers. For example, in OLED light extraction applications, the nanostructure imparted by the lamination transfer film is located at a structured interface of the backfill and planarization layers. The backfill layer has a first side at the structured interface and a second side coincident with an adjacent layer. The planarization layer has a first side at the structured interface and a second side coincident with an adjacent layer. In this application, the refractive index of the backfill layer is index matched to the adjacent layer to the backfill layer opposite the structured interface, while the refractive index of the planarization layer is index matched to the adjacent layer to the planarization layer opposite the structured interface.

Nanoparticles can be used to adjust refractive index of the backfill and planarization layers. For example, in acrylic coatings, silica nanoparticles (n≈1.42) can be used to decrease refractive index, while zirconia nanoparticles (n≈2.1) can be used to increase the refractive index. If the index difference is large between the nanoparticles and binder, a haze will develop inside the bulk of the coating. For applications in which haze is a desirable attribute (e.g., uniform light distribution in OLED solid state lighting elements), this limit can be exceeded. There is also a limit to the concentration of nanoparticles in the resin before particle aggregation begins to occur, thereby limiting the extent to which refractive index of the coating can be tuned.

TABLE 1

Thermally Stable Backfill Materials of Low and High Refractive Index

| Material Name or Trade Designation | Type | Available from |
|---|---|---|
| TecheGlas GRx resins | T-resin (methyl silsesquioxane) | TechneGlas (Perrysburg, Ohio) |
| HSG-510 | T-resin (methyl silsesquioxane) | Hitachi Chemical (Tokyo, Japan) |
| ACCUGLASS 211 | T-Q resin (methyl silsesquioxane) | Honeywell (Tempe, AZ) |
| HARDSIL AM | silica nanocomposite | Gelest Inc (Morrisville, PA) |
| MTMS-BTSE Copolymer (Ro et. al, *Adv. Mater.* 2007, 19, 705-710) | bridged silsesquioxane | National Institute of Standards and Technology (Gaithersburg, MD) |
| PERMANEW 6000 | silica-filled methyl-polysiloxane polymer containing a latent heat-cure catalyst system | California Hardcoat (Chula Vista, CA) |
| FOX Flowable OXide | hydrogen silsesquioxane | Dow Corning (Midland, MI) |
| ORMOCER, ORMOCLAD, ORMOCORE | silicone hybrid | Micro Resist GmBH (Berlin, Germany) |
| SILECS SCx resins | silicone hybrid (n = 1.85) | Silecs Oy (Espoo, Finland) |
| OPTINDEX D1 | soluble polyimide (n = 1.8) | Brewer Science (Rolla, MO) |
| CORIN XLS resins | soluble polyimide | NeXolve Corp. (Huntsville, AL) |
| CERASET resins | polysilazanes | KiON Specialty Polymers (Charlotte, NC) |
| BOLTON metals | low melting metal | Bolton Metal Products (Bellafonte, PA) |
| CYCLOTENE resins | benzocyclobutane polymers | Dow Chemical (Midland, MI) |
| SYLGARD 184 | silicone network polymer | Dow Corning (Midland, MI) |

Adhesion Promoting Layer Materials

The adhesion promoting layer can be implemented with any material enhancing adhesion of the transfer film to the receptor substrate without substantially adversely affecting the performance of the transfer film. The exemplary materials for the backfill and planarization layers can also be used for the adhesion promoting layer. A typical material for the adhesion promoting layer is the CYCLOTENE resin identified in Table 1. Other useful adhesion promoting materials useful in the disclosed articles and methods include photoresists (positive and negative), self-assembled monolayers, silane coupling agents, and macromolecules. In some embodiments, silsesquioxanes can function as adhesion promoting layers. Other exemplary materials may include benzocyclobutanes, polyimides, polyamides, silicones, polysiloxanes, silicone hybrid polymers, (meth)acrylates, and other silanes or macromolecules functionalized with a wide variety of reactive groups such as epoxide, episulfide, vinyl, hydroxyl, allyloxy, (meth)acrylate, isocyanate, cyanoester, acetoxy, (meth)acrylamide, thiol, silanol, carboxylic acid, amino, vinyl ether, phenolic, aldehyde, alkyl halide, cinnamate, azide, aziridine, alkene, carbamates, imide, amide, alkyne, and any derivatives or combinations of these groups.

Release Liners

The backfill layer can, optionally, be covered with a temporary release liner. The release liner can protect the patterned structured backfill during handling and can be easily removed, when desired, for transfer of the structured backfill or part of the structured backfill to a receptor substrate. Exemplary liners useful for the disclosed patterned structured tape are disclosed in PCT Pat. Appl. Publ. No. WO 2012/082536 (Baran et al.).

The liner may be flexible or rigid. Preferably, it is flexible. A suitable liner (preferably, a flexible liner) is typically at least 0.5 mil thick, and typically no more than 20 mils thick. The liner may be a backing with a release coating disposed on its first surface. Optionally, a release coating can be disposed on its second surface. If this backing is used in a transfer article that is in the form of a roll, the second release coating has a lower release value than the first release coating. Suitable materials that can function as a rigid liner include metals, metal alloys, metal-matrix composites, metalized plastics, inorganic glasses and vitrified organic resins, formed ceramics, and polymer matrix reinforced composites.

Exemplary liner materials include paper and polymeric materials. For example, flexible backings include densified Kraft paper (such as those commercially available from Loparex North America, Willowbrook, Ill.), poly-coated paper such as polyethylene coated Kraft paper, and polymeric film. Suitable polymeric films include polyester, polycarbonate, polypropylene, polyethylene, cellulose, polyamide, polyimide, polysilicone, polytetrafluoroethylene, polyethylenephthalate, polyvinylchloride, polycarbonate, or combinations thereof. Nonwoven or woven liners may also be useful. Embodiments with a nonwoven or woven liner could incorporate a release coating. CLEARSIL T50 Release liner; silicone coated 2 mil polyester film liner, available from Solutia/CP Films, Martinsville, Va., and LOPAREX 5100 Release Liner, fluorosilicone-coated 2 mil polyester film liner available from Loparex, Hammond, Wis., are examples of useful release liners.

The release coating of the liner may be a fluorine-containing material, a silicon-containing material, a fluoropolymer, a silicone polymer, or a poly(meth)acrylate ester derived from a monomer comprising an alkyl (meth)acrylate having an alkyl group with 12 to 30 carbon atoms. In one embodiment, the alkyl group can be branched. Illustrative examples of useful fluoropolymers and silicone polymers can be found in U.S. Pat. No. 4,472,480 (Olson), U.S. Pat. Nos. 4,567,073 and 4,614,667 (both Larson et al.). Illustrative examples of a useful poly(meth)acrylate ester can be found in U.S. Pat. Appl. Publ. No. 2005/118352 (Suwa). The removal of the liner shouldn't negatively alter the surface topology of the backfill layer.

Other Additives

Other suitable additives to include in the backfill and adhesion promotion layer are antioxidants, stabilizers, antiozonants and/or inhibitors to prevent premature curing during the process of storage, shipping and handling of the film. Preventing premature curing can maintain the tack required for lamination transfer in all previously mentioned embodiments. Antioxidants can prevent the formation of free radical species, which may lead to electron transfers and chain reactions such as polymerization. Antioxidants can be used to decompose such radicals. Suitable antioxidants may include, for example, antioxidants under the IRGANOX tradename. The molecular structures for antioxidants are typically hindered phenolic structures, such as 2,6-di-tert-butylphenol, 2,6-di-tert-butyl-4-methylphenol, or structures based on aromatic amines. Secondary antioxidants are also used to decompose hydroperoxide radicals, such as phosphites or phosphonites, organic sulphur containing compounds and dithiophosphonates. Typical polymerization inhibitors include quinone structures such hydroquinone, 2,5 di-tert-butyl-hydroquinone, monomethyl ether hydroquinone or catechol derivatives such as 4-tert butyl catechol. Any antioxidants, stabilizers, antiozonants and inhibitors used must be soluble in the backfill and adhesion promotion layer.

EXAMPLES

All parts, percentages, ratios, etc. in the examples are by weight, unless noted otherwise. Solvents and other reagents used were obtained from Sigma-Aldrich Corp., St. Louis, Mo. unless specified differently.

Examples 1 and 2 use the procedures illustrated in FIG. 1.

Example 1: Hardcoat with Adhesion Promotion Layer

Template/Release Coating

The base film was a flame treated 2 mil (50 μm) KAPTON H, primed with a actinic radiation cured primer comprising 50/50 blend of UVACURE 1500 (Cytec, Woodland Park, N.Y.) and trimethylolpropane triacrylate (TMPTA) with 1% OMAN 071 photoinitiator (available from Gelest, Morrisville, Pa.).

The replicating resin was a 75/25 blend of dipentaerythritol pentaacrylate (SR 399) and 1,6-hexanediol diacrylate (SR 238), both available from Sartomer, Exton, Pa., with a photoinitiator package comprising 1% DAROCUR 1173 (available from Ciba, Basel, Switzerland, 1.9% triethanolamine, 0.5% OMAN 071, and 0.3% methylene blue. Replication of the resin was conducted at 20 feet/minute (fpm) with the tool temperature at 137° F. (58.3° C.). Radiation from a Fusion "D" lamp operating at 600 W/in (236 W/cm) was transmitted through the film to cure the resin while in contact with the tool. The composite film was removed from the tool and the patterned side of the film was post radiation cured using a Fusion "D" lamp operating at 360 W/in (142 W/cm) while in contact with a chill roll heated to 100° F. (37.8° C.).

The replicated template film was primed with argon gas at a flow rate of 250 standard cc 3/min (SCCM), a pressure of 25 mTorr and RF power of 1000 Watts for 30 seconds. Subsequently, the samples were exposed to tetramethylsilane (TMS) plasma at a TMS flow rate of 150 SCCM but no added oxygen; this corresponds to an atomic ratio of oxygen to silicon of about 0. The pressure in the chamber was 25 mTorr, the RF power 1000 Watts was maintained for 10 seconds.

Backfill Coating

A length (120 cm×30 cm) of the replicated template film was placed on a flat metal plate. PERMANEW 6000 L510-1 (available from California Hardcoat, Chula Vista, Calif.) was diluted to 10% w/w in isopropanol, and brought to room temperature. Approximately 5 mL of PERMANEW 6000 L510-1 was applied to the replicated film and then coated with a #10 Mayer bar onto the film to produce a backfilled sample. The film was dried at 50° C. for 10 minutes. The sample was then allowed to cool to room temperature.

Adhesion Promoter Coating

Polished glass slides, 50 mm×50 mm, were first cleaned with a lint free cloth, then sonicated in a wash chamber for 20 minutes with detergent, then 20 minutes in each of two cascading rinse chambers with heated water. The slides were then dried for 20 minutes in an oven with circulating air. The slides were mounted on a the vacuum chuck of a Model WS-6505-6npp/lite spin coater. A vacuum of 64 kPa (48 mm of Hg) was applied to hold the sample to the chuck. The spin coater was programmed for 500 RPM for 5 seconds (coating application step) then 2000 RPM for 15 sec (spin step), then 1000 RPM for 10 seconds (dry step).

A solution of (CYCLOTENE 3022 63 resin, 63% w/w stock, from DOW Chemical Company, Midland, Mich.) was diluted to 25% w/w in mesitylene. Approximately 1-2 mL of the CYCLOTENE solution 25% w/w was applied to the sample during the coating application portion of the spin cycle. The sample was then removed from the spin coater and put on a hotplate at 90° C. for 5 minutes while covered with an aluminum tray. The sample was allowed to cool to room temperature.

Lamination

The backfilled template was laminated at 230° F. (110° C.), coating side down, to the CYCLOTENE-coated cleaned glass slide using a thermal film laminator (GBC Catena 35, GBC Document Finishing, Lincolnshire, Ill.). The laminated sample was removed from the hotplate and allowed cool to room temperature.

Firing

Figure 12:
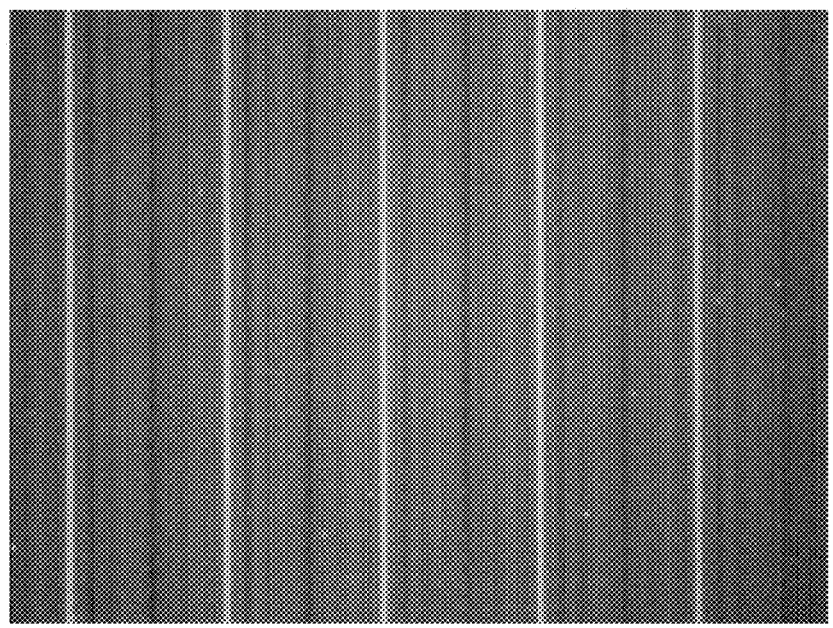
FIG. 12 is a photomicrograph of nanostructures on glass from Example 1.

The template tool was peeled from the sample, transferring the replicated backfill material to the glass slide. The laminated sample was placed in a box furnace and brought from 25° C. to 500° C. at a rate of about 5° C./min. The furnace was held at 500° C. for one hour, then the furnace and sample were allowed to cool down naturally. The result was a transparent glass substrate having nanostructures and is shown in FIG. 12.

Example 2: Acrylate Structure with Radiation Releasable PSA Adhesion Promotion Layer A release coated template layer was constructed as in Example 1.

Backfill Coating

An acrylate resin system (2-propenoic acid (1-methylethylidene)bis[(2,6-dibromo-4,1-phenylene)oxy(2-hydroxy-3,1-propanediyl)]ester, phenoxyethyl acrylate and trimethylol propane triacrylate (65/25/10) containing photoinitiator (0.1% 2,4,6-trimethylbenzoyldiphenylphosphine oxide and 0.35% 2-hydroxy-2-methyl-1-phenyl-propan-1-one) as described in U.S. Pat. Appl. Publ. No. 2006/0004166 (Olson) was knife coated onto the replicated template film with as thin a layer as possible. The function of this layer is to just fill the nanostructure with a hard acrylate that would add durability to the final film. The acrylate coated template was cured in a belt fed cure chamber (RPC industries) fitted with a Fusion H bulb in Nitrogen (2 passes, 20 fpm). The sample was removed from the chamber, and cooled to room temperature.

A radiation releasable pressure sensitive adhesive (PSA) system (IOA/MA/AA (57.5/35/7.5) was mixed with 25% w/w SR494 (pentaerithrotol tetraacrylate from Sartomer Co.) and 1 wt % DAROCUR 1173 (photoinitiator from Ciba/BASF). The mixture was diluted to 20% solids in ethyl acetate/toluene. The PSA system disclosed above was knife coated onto a section of the cured, filled template film disclosed above with a gap of 4 mil (100 μm). The film was dried at 70° C. for 10 minutes. The sample was then allowed to cool to room temperature.

Lamination

The sample was hand laminated to a pane of glass at room temperature. The glass was then heated to 90° C. on a hotplate, and hand laminated again. The sample was cured in a belt fed cure chamber (RPC industries) fitted with a Fusion H bulb in nitrogen (2 passes, 20 fpm). The sample was removed from the chamber, and cooled to room temperature. The Polyethylene replicated template was removed from the sample, leaving cured nanostructure on the glass substrate.

Examples 3-6 use the procedures illustrated in FIG. 3.

Example 3: Radiation Releasable PSA

A polymeric pressure sensitive adhesive composition with multifunctional acrylate addition, which exhibits substantial initial adhesion, but upon radiation curing, adhesion is significantly reduced and the pressure sensitive adhesive is easily removable from the template film.

A release coated template layer was constructed as in Example 1.

Backfill Coating

A radiation releasable pressure sensitive adhesive (PSA) system made from isocetyl acylate/methacrylate/acrylic acid, 26% solids by weight in ethyl acetate and toluene, is a copolymer with a monomer ratio of 57.5/35/7.5, and is prepared as described in U.S. Pat. No. RE 24,906 (Ulrich). This PSA system was mixed with 25% w/w SR494 (pentaerithrotol tetraacrylate from Sartomer Co.) and 1 wt % DAROCUR 1173 (photoinitiator from Ciba/BASF). The mixture was diluted to 20% solids in ethyl acetate/toluene. The PSA system disclosed above was coated onto a section of the replicated template film disclosed above using a doctor blade. The film was dried at 90° C. for 10 minutes. The sample was then allowed to cool to room temperature.

Lamination

The sample was hand laminated to a pane of glass at room temperature. The glass was then heated to 90° C. on a hotplate, and hand laminated again. The sample was cured in a belt fed cure chamber (RPC industries) fitted with a Fusion H bulb in nitrogen (2 passes, 20 fpm). The sample was removed from the chamber, and cooled to room temperature. The replicated template was removed from the sample, leaving cured nanostructure on the glass substrate.

Example 4

QPAC 100 (Empower Materials) was coated onto the backside of a CLEARSIL, silicone release liner T-50 (available from CPFilms Inc, Dubvai, UAE) and embossed with nanoscale features as disclosed in U.S. patent application Ser. No. 13/553,987, entitled "STRUCTURED LAMINA- TION TRANSFER FILMS AND METHODS", filed Jul. 20, 2012. The coated film was approximately four microns thick, and the embossed impressions were of 600 nm pitch, with a 1:1 height to pitch ratio sawtooth pattern. A silicone material SYLGARD 184 (Dow) was prepared according to literature procedures. The SYLGARD 184 base resin was mixed with the crosslinker in a 10:1 ratio in a plastic cup. The mixture was slowly stirred for three minutes with a spatula until a homogenous solution was obtained. The mixture was placed in a dessicator under reduced pressure for about 1 hour to remove all trapped air bubbles from the resin mixture. The mixture was poured on top of the embossed QPAC100 and notch-bar coated with a 1 mil gap, and then placed in a vacuum oven at 80° C. for 3 hours. The vacuum environment was used to help remove entrapped air from the nanoscale features during the curing process. After the cure, the SYLGARD 184/QPAC100/T50 stack was placed in a plasma chamber along with glass microscope slides. Both materials were exposed to an oxygen plasma for 1 minute (75 W, 0.6 mTorr, 50 sccm $O_2$), and then the SYLGARD 184 stack was flipped over and brought into contact immediately with the glass side while laminating at 0.1 ft/min (3.0 cm/min). The samples were heated for 30 minutes in a 120° C. oven to bond the silicone and the glass surfaces together. Finally, the QPAC100/T50 mold was peeled off of the SYLGARD 184, leaving behind a negative replica of the nanoembossed features.

Example 5

QPAC 100 (Empower Materials) was coated onto the backside of a T50 release liner and embossed with nanoscale features as disclosed in Example 4. The coated film was approximately four microns thick, and the embossed impressions were of 600 nm pitch, with a 1:1 height to pitch ratio sawtooth pattern disclosed in IS N019969. A UV curable silicone material was prepared according to the following procedures. VQM-135 (Gelest) base resin was mixed with a crosslinker SYL-OFF 7678 (Dow) in a 10:1 ratio in a plastic cup. 10 ppm of a platinum photohydrosilylation catalyst (MeCp)PtMe$_3$, Alfa Aesar) was added to the resin solution stirred for three minutes with a spatula. The mixture was placed on an 80° C. hotplate for 15 minutes to reduce viscosity before coating. The mixture was poured on top of the embossed QPAC100 and notch-bar coated with a 1 mil (25 µm) gap, and then cured under a high-intensity ultraviolet lamp (Fusion D Bulb, 3 passes at 20 feet/min). The PSE-002/QPAC100/T50 stack was flipped over and brought into contact immediately with an oxygen plasma treated glass side while laminating at 0.1 ft/min (3.0 cm/min). The samples were heated for 20 minutes in a 120° C. oven to complete the cure of the silicone and bond the silicone to the glass. After cooling the sample on an aluminum plate, the QPAC100/T50 mold was peeled off of the PSE-002, leaving behind a negative replica of the nanoembossed features.

Example 6

QPAC 100 (Empower Materials) was coated onto the backside of a T50 release liner following the procedure in Example 4. The coated film was approximately four microns thick, and the embossed impressions were of 600 nm pitch, with a 1:1 height to pitch ratio sawtooth pattern. HARDSIL AM hardcoat solution was purchased from Gelest, notch-bar coated on top of the embossed QPAC100 with a 1 mil (25 µm) gap, and dried overnight at 90° C. (15 hours). A UV-curable silicone material was prepared according to the following procedures. VQM-135 (Gelest) base resin was mixed with a crosslinker SYL-OFF 7678 (Dow) in a 10:1 ratio in a plastic cup. 10 ppm of a platinum photohydrosilylation catalyst ((MeCp)PtMe$_3$, Alfa Aesar) was added to the resin solution and stirred for three minutes with a spatula. The mixture was poured on top of the cured HARDSIL AM and notch-bar coated with a with a 2 mil (50 µm) gap, and then cured under a high-intensity ultraviolet lamp (Fusion D Bulb, 3 passes at 20 feet/min), followed by a 90° C. overnight cure (15 hrs). The PSE-002 top surface and a glass slide was exposed to oxygen plasma for 1 minute (75 W, 0.6 mTorr, 50 sccm $O_2$), and then the two materials brought into contact immediately with a lamination at 0.1 ft/min (3.0 cm/min). A drop of water in between the two surfaces improved uniformity during the lamination transfer step. The samples were heated for 5 minutes on a 120° C. hotplate to bond the silicone to the glass slide. After cooling the sample on an aluminum plate, the QPAC100/T50 mold was peeled off of the Hardsil AM/PSE-002/Glass, leaving behind a negative replica of the nanoembossed features on glass.

Examples 7 and 8 use the processes disclosed in FIG. 2

Example 7: Patterned Hardcoat

Figure 13:
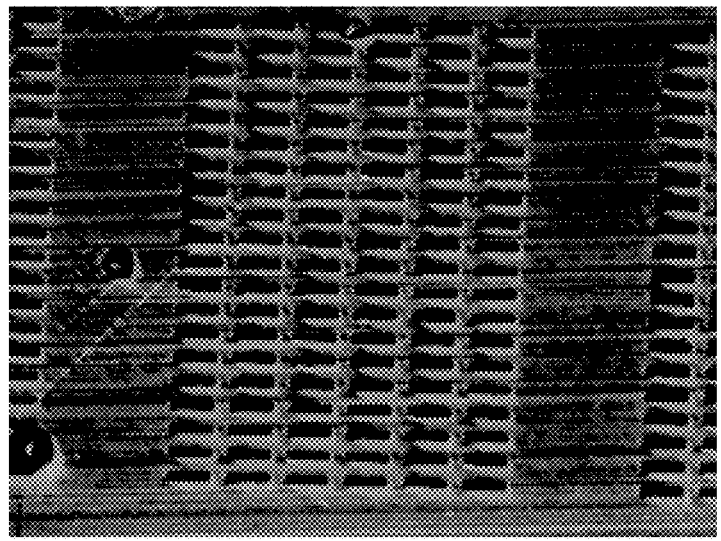
FIG. 13 is a photomicrograph of patterned nanostructures on glass from Example 7.

A release coated template layer was constructed as in Example 1.
Backfill Coating
A length (120 cm×30 cm) of the replicated template film was placed on a flat metal plate. PERMANEW 6000 L510-1 (available from California Hardcoat, Chula Vista, Calif.) was diluted to 10% w/w in isopropanol, and brought to room temperature. 5 mL of PERMANEW 6000 L510-1 was applied to the replicated film, then Mayer bar (#10) coated onto the film to produce a backfilled sample. The film was dried at 50° C. for 10 minutes. The sample was then allowed to cool to room temperature.
Patterned Adhesion Layer
Polished glass slides, 50 mm×50 mm, were first cleaned with a lint free cloth, then sonicated in a wash chamber for 20 minutes with detergent, then 20 minutes in each of two cascading rinse chambers with heated water. The slides were then dried for 20 minutes in an oven with circulating air. The slides were pre-baked at 80° C. for 20 to 30 minutes. A slide was mounted on the chuck of a Karl Suss spin coater. The spin coater was programmed for 4000 RPM for 40 seconds with a 2000 rpm ramp. A solution of TOK TELR-P003PM positive photoresist (Tokyo Ohka Kogyo Co., Ltd., Kanagawa, JAPAN was applied to the sample during the coating application portion of the spin cycle. The sample was then removed from the spin coater and soft baked on a hotplate at 95° C. for 20 minutes. The coated sample was imaged with a pixel size test pattern with constant pitch and varying area with an UV intensity of 66 mJ/cm2 for 2.44 seconds. The resist was developed with MICROPOSIT MF-319 developer (Rohm and Haas Electronic Materials LLC, Marlborough, Mass. 01752 United States of America) for 60 seconds with agitation, then rinsed in cascading DI water and dried with nitrogen. The sample was then hardbaked by first preheating to 200° C. for 2-3 minutes, then baked on a hotplate at 250° C. for 30 minutes.
Lamination
The backfilled template film was laminated at 230° F. (110° C.), coating side down, to the patterned photoresist coated cleaned glass slide using a thermal film laminator (GBC Catena 35, GBC Document Finishing, Lincolnshire, Ill.). The laminated sample was removed from the hotplate and allowed cool to room temperature. The template tool was peeled from the sample, transferring the replicated backfill material to the photoresist on the glass slide. The result was a transparent glass substrate having patterned nanostructures and is depicted in FIG. 13.

Example 8: Patterned Hardcoat

Sacrificial Material Layer Coating and Embossing

A 5 wt % solution of QPAC 100 in 1,3-dioxolane was delivered at a rate of 30 cm³/min to a 10.2 cm (4 inch) wide slot-type coating die in continuous film coating apparatus. The solution was coated on the backside of a 0.051 mm (0.002 inch) thick T50 silicone release liner. The coated web traveled approximately 2.4 m (8 ft) before entering a 9.1 m (30 ft) conventional air floatation drier with all 3 zones set at 65.5° C. (150° F.). The substrate was moving at a speed of 3.05 m/min (10 ft/min) to achieve a wet coating thickness of about 80 micrometers.

The coated film was then embossed in a nip under a pressure of 1.75 kN/cm (1000 pounds per lineal inch) against a metal master tool with 600 nm pitch linear sawtooth grooves at a temperature of 110° C. (230° F.). Embossing line speed was 0.61 m/min (2 ft/min).

Backfill Coating

A section of the embossed film was treated with an air corona in a roll to roll process using a dual ceramic bar apparatus powered by a Universal Compak power supply (Enercon Industries Corporation, Menomonee Falls, Wis.). The system was configured to apply 0.75 J to the sample at 1.5 m/min (5 ft/min) in air, with a 3.2 mm (⅛ inch) gap between the ceramic bar and the sample.

A sample of the corona treated embossed film (≈2 in×3 in) was coated with PERMANEW 6000 L510-1, which was applied to the embossed film sample by spin coating. Prior to spin coating, the PERMANEW 6000 was diluted to 17.3 wt % in isopropanol and filtered through a 0.8 µm filter. A glass microscope slide was used to support the film during the coating process. The spin parameters were 500 rpm/3 sec (solution application), and 3000 rpm/10 sec (spin down). The sample was removed from spin coater and placed on a hotplate at 50° C. for 30 min to complete the drying process. After drying, the backfilled sample was placed on a hotplate at 70° C. for 4 hours to cure the PERMANEW 6000.

Patterned Adhesion Layer

Polished glass slides, 50 mm×50 mm, were first cleaned with a lint free cloth, then sonicated in a wash chamber for 20 minutes with detergent, then 20 minutes in each of two cascading rinse chambers with heated water. The slides were then dried for 20 minutes in an oven with circulating air. The slides were pre-baked at 80° C. for 20 to 30 minutes. A slide was mounted on the chuck of a Karl Suss spin coater. The spin coater was programmed for 4000 RPM for 40 seconds with a 2000 rpm ramp. A solution of TOK TELR-P003PM positive photoresist (Tokyo Ohka Kogyo Co., Ltd., Kanagawa, JAPAN) was applied to the sample during the coating application portion of the spin cycle. The sample was then removed from the spin coater and soft baked on a hotplate at 95° C. for 20 minutes.

The coated sample was imaged with a pixel size test pattern with constant pitch and varying area with an ACTINIC intensity of 66 mJ/cm2 for 2.44 seconds. The resist was developed with MICROPOSI MF 319 developer (Rohm and Haas Electronic Materials LLC, Marlborough, Mass. 01752 United States of America) for 60 seconds with agitation, then rinsed in cascading DI water and dried with nitrogen. The sample was then hardbaked by first preheating to 200° C. for 2-3 minutes, then baked on a hotplate at 250° C. for 30 minutes.

Lamination and Autoclaving

A drop of deionized water was applied to the patterned glass slide to promote adhesion between the PERMANEW 6000 and the patterned photoresist and the backfilled template film was laminated at 230° F. (110° C.), coating side down, to the patterned photoresist coated cleaned glass slide using a thermal film laminator (GBC Catena 35, GBC Document Finishing, Lincolnshire, Ill.). The laminated sample was allowed cool to room temperature. To remove any air bubbles left by the lamination step, the laminated sample was placed in an Autoclave at 75° C. and 6.5 psi for 30 mins. The T50 film was peeled from the sample, transferring the sacrificial template and backfill material to the patterned glass slide.

Sacrificial Template Removal

The laminated sample was placed in a tube furnace at room temperature. The furnace was purged with nitrogen gas for the duration of the experiment. The temperature was then ramped from 25° C. to 300° C. at 10° C./min and held at 300° C. for 3 hours. The furnace and sample cooled to ambient temperature. The resulting nanostructured sample was transparent and exhibited iridescence that is characteristic of a linear optical grating.

Removal of Nanostructure from Unpatterned Areas

Figure 14:
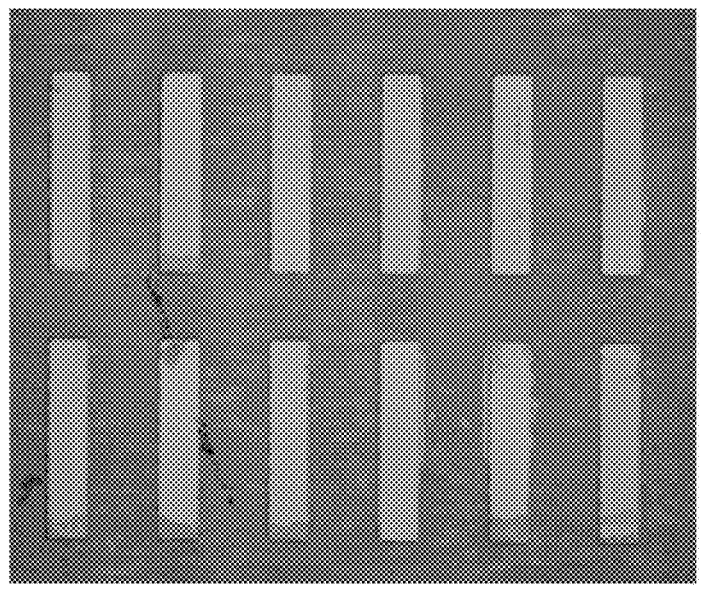
FIG. 14 is a photomicrograph of patterned nanostructures on glass from Example 8.

After removal of the sacrificial template, the nanostructured sample was placed in a glass beaker filled with deionized water and the beaker was placed in an ultrasonic cleaner (PC3 by L&R Ultrasonics of Kearny, N.J.) for 30 min. The result was a transparent glass substrate having patterned nanostructures. The results are shown in FIG. 14. The lighter rectangles are areas where the nanostructure was not transferred to the substrate.

Example 9 uses the procedure disclosed in FIG. 8.

Example 9: Vinyl Silsesquioxane Patterned with Vias

A release coated template layer was constructed as in Example 1.

Preparation of Vinylsilsesquioxane

Vinyltriethoxysilane (100 g) (Gelest Inc., Morrisville, Pa. USA), deionized water (50 g), and oxalic acid (0.5 g) (Sigma-Aldrich, St. Louis, Mo.) were mixed together at room temperature in a 500 mL round bottom flask equipped with a condenser. The mixture was stirred at room temperature for 6-8 hrs followed by the evaporation of the solvents (water/ethanol mixture). The resulting viscous liquid was dissolved in methyl ethyl ketone (100 mL) and washed three-times with deionized water (100 mL). After washing, the methyl ethyl ketone and residual water was evaporated under reduced pressure to yield vinylsilsesquioxane as viscous liquid. A vinylsilsesquioxane radiation curable system was prepared by redisolving the vinylsilsesquioxane in methyl ethyl ketone to a 30% w/w solution with 1% w/w IRGACURE184 (photoinitiator from Ciba/BASF).

Backfill Coating

A piece of the template film slightly larger than 5.1 cm×7.6 cm (2 inch×3 inch) was adhered to a 1 mm thick 5.1 cm×7.6 cm (2 inch×3 inch) glass microscope slide (available from VWR International, Radnor Pa.) with tape. The glass slide and sample were then put on a Model WS-6505-6npp/lite spin coater (available from Laurell Technologies Corporation, North Wales Pa.) directly on the vacuum chuck. A vacuum of 64 kPa (19 inches of Hg) was applied to hold the sample to the chuck. The spin coater was programmed for 500 RPM for 5 seconds (coating application step) then 1000 RPM for 15 sec (spin step), then 1000 RPM for 20 seconds (dry step). Approximately 1-2 mL of the vinyl silsesquioxane radiation curable system was applied to the template film during the coating application portion of the spin cycle, to produce a backfilled sample.

Figure 15:
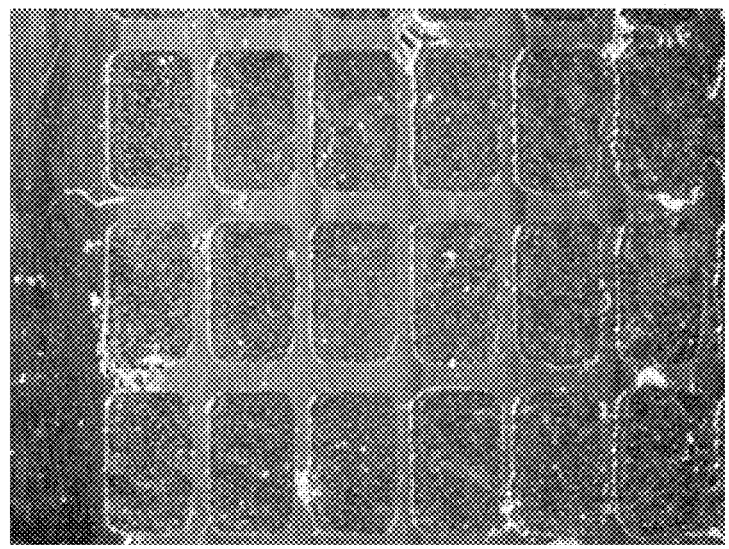
FIG. 15 is a photomicrograph of patterned nanostructures on glass having vias from Example 9.
Figure 16:
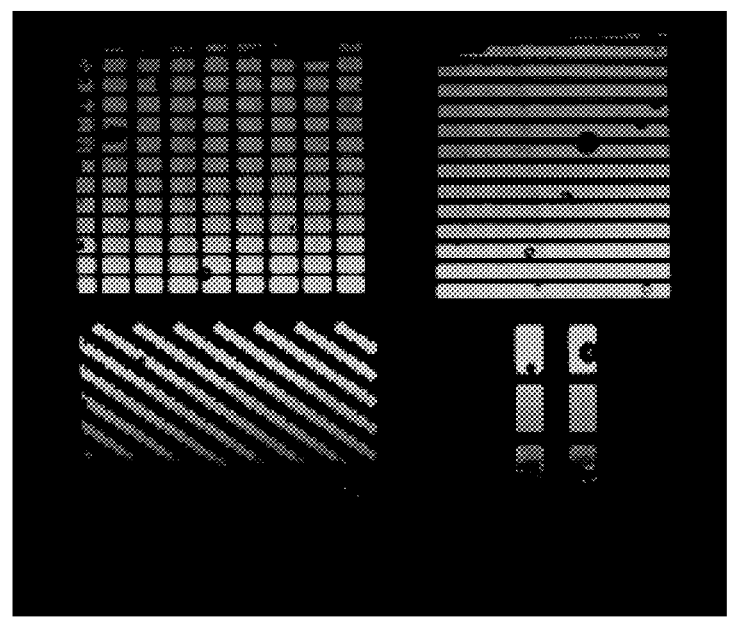
FIG. 16 is a photomicrograph of patterned nanostructures on glass from Example 11.

The sample was removed from spin coater and placed on a hotplate at 50° C. for 30 minutes, covered with an aluminum tray. The sample was then allowed to cool to room temperature. The sample was laminated at room temperature, coating side down, to a fluorinated/siliconized release liner using a thermal film laminator (GBC Catena 35, GBC Document Finishing, Lincolnshire, Ill.). The laminated sample was allowed cool to room temperature. The coated sample was then imaged with a nickel on quartz phototool through the release liner, in a belt fed cure chamber (RPC industries) fitted with a Fusion H bulb (1 pass, 25 fpm). The sample was removed from the chamber, and cooled to room temperature. The release liner was removed from the sample, and then laminated at 230° F. (110° C.), coating side down, to a 1 mm thick 5.1 cm×7.6 cm (2 inch×3 inch) glass microscope slide (available from VWR International, Radnor Pa.) using a thermal film laminator (GBC Catena 35, GBC Document Finishing, Lincolnshire, Ill.). The laminated sample was allowed cool to room temperature. The laminated sample was then cured in a belt fed cure chamber (RPC industries) fitted with a Fusion H bulb in nitrogen (1 pass, 25 fpm). The sample was removed from the chamber, and cooled to room temperature. The template film was then removed from the sample, leaving a cured, patterned nanostructured layer on the glass (FIG. 15).

Example 10 uses the procedure illustrated in FIG. 6.

Example 10: Patterned Vinyl Silsesquioxane

A release coated template layer was constructed as in Example 1.

Vinyl silsesquioxane was prepared as disclosed in Example 9.

Backfill Coating

A piece of the template film slightly larger than 5.1 cm×7.6 cm (2 inch×3 inch) was adhered to a 1 mm thick 5.1 cm×7.6 cm (2 inch×3 inch) glass microscope slide (available from VWR International, Radnor, Pa.) with tape. The glass slide and sample were then put on a Model WS-6505-6npp/lite spin coater (available from Laurell Technologies Corporation, North Wales Pa.) directly on the vacuum chuck. A vacuum of 64 kPa (483 mm Hg) was applied to hold the sample to the chuck. The spin coater was programmed for 500 RPM for 5 seconds (coating application step) then 1000 RPM for 15 sec (spin step), then 1000 RPM for 20 seconds (dry step). Approximately 1-2 mL of the vinyl silsesquioxane radiation curable system was applied to the template film during the coating application portion of the spin cycle, to produce a backfilled sample.

The sample was removed from spin coater and placed on a hotplate at 50° C. for 30 minutes, covered with an aluminum tray. The sample was then allowed to cool to room temperature. The sample was laminated at room temperature, coating side down, to a fluorinated/siliconized release liner using a thermal film laminator (GBC Catena 35, GBC Document Finishing, Lincolnshire, Ill.). The laminated sample was allowed cool to room temperature. The coated sample was then imaged with a nickel on quartz phototool through the release liner, in a belt fed cure chamber (RPC industries) fitted with a Fusion H bulb (1 pass, 25 fpm). The sample was removed from the chamber, and cooled to room temperature. ACTINIC The release liner was removed from the sample, and adhered to a 1 mm thick 5.1 cm×7.6 cm (2 inch×3 inch) glass microscope slide (available from VWR International, Radnor Pa.) with tape, coating side up. The glass slide and sample were then put on a Model WS-6505-6npp/lite spin coater (available from Laurell Technologies Corporation, North Wales Pa.) directly on the vacuum chuck. A vacuum of 64 kPa (19 inches of Hg) was applied to hold the sample to the chuck. The spin coater was programmed for 500 RPM for 5 seconds (coating application step) then 1000 RPM for 15 sec (spin step), then 1000 RPM for 20 seconds (dry step). Approximately 1-2 mL of the vinyl silsesquioxane radiation curable system was applied to the template film during the coating application portion of the spin cycle, to produce a backfilled sample.

The sample was removed from spin coater and placed on a hotplate at 50° C. for 30 minutes, covered with an aluminum tray. The sample was then allowed to cool to room temperature. The sample was laminated at room temperature, coating side down, to a 1 mm thick 5.1 cm×7.6 cm (2 inch×3 inch) glass microscope slide (available from VWR International, Radnor Pa.) using a thermal film laminator (GBC Catena 35, GBC Document Finishing, Lincolnshire, Ill.). The laminated sample was allowed to cool to room temperature.

The template film was then removed from the sample. The uncured areas were allowed to reflow, effectively removing the nanostructure in these areas. The laminated sample was then cured in a belt fed cure chamber (RPC industries) fitted with a Fusion H bulb in nitrogen (1 pass, 25 fpm). The sample was removed from the chamber, and cooled to room temperature. This process produced a patterned, nanostructured sample where the unstructured areas retained material but did not retain structure.

Example 11 and 12 use the procedure disclosed in FIG. 4.

Example 11: Patterned Vinyl Silsesquioxane

A release coated template layer was constructed as in Example 1. Vinyl silsesquioxane was prepared as disclosed in Example 9.

Backfill Coating

A piece of the template film slightly larger than 5.1 cm×7.6 cm (2 inch×3 inch) was adhered to a 1 mm thick 5.1 cm×7.6 cm (2 inch×3 inch) glass microscope slide (available from VWR International, Radnor Pa.) with tape. The glass slide and sample were then put on a Model WS-6505-6npp/lite spin coater (available from Laurell Technologies Corporation, North Wales Pa.) directly on the vacuum chuck. A vacuum of 64 kPa (19 inches of Hg) was applied to hold the sample to the chuck. The spin coater was programmed for 500 RPM for 5 seconds (coating application step) then 1000 RPM for 15 sec (spin step), then 1000 RPM for 20 seconds (dry step). Approximately 1-2 mL of the vinyl silsesquioxane radiation curable system was applied to the template film during the coating application portion of the spin cycle, to produce a backfilled sample.

The sample was removed from spin coater and placed on a hotplate at 50° C. for 30 minutes, covered with an aluminum tray. The sample was then allowed to cool to room temperature. The sample was laminated at 230° F. (110° C.), coating side down, to a 1 mm thick 5.1 cm×7.6 cm (2 inch×3 inch) glass microscope slide (available from VWR International, Radnor Pa.) using a thermal film laminator (GBC Catena 35, GBC Document Finishing, Lincolnshire, Ill.).

The laminated sample was allowed cool to room temperature. The laminated sample was then imaged with a nickel on quartz phototool through the release liner in a belt fed cure chamber (RPC industries) fitted with a Fusion H bulb (1 pass, 25 fpm). The sample was removed from the chamber, and cooled to room temperature. The template film was removed, and the uncured areas allowed to reflow for 1-5 minutes at room temperature. The sample was then cured in a belt fed cure chamber (RPC industries) fitted with a Fusion H bulb in nitrogen (1 pass, 25 fpm). The sample was removed from the chamber, and cooled to room temperature. This process produced a patterned, nanostructured sample where the unstructured areas retained material but did not retain structure as shown in FIG. 19.

Materials

| Abbreviation/ product name | Description | Available from |
|---|---|---|
| 3-mercaptopropyl trimethoxysilane | Chain Transfer Agent, 95% | Alfa Aesar, Ward Hill, MA |
| Isooctyl Acrylate | Isooctyl Acrylate | Sigma-Aldrich Chemical Company, Milwaukee, WI |
| hydroxy-ethyl acrylate | hydroxy-ethyl acrylate | Alfa Aesar, Ward Hill, MA |
| ethyl acetate | solvent | Honeywell International, Inc., Morristown, NJ. |
| NTB-1 | 15% wt aqueous titanium dioxide sol with pH at 4 | Denko Corporation, Japan |
| Phenyltrimethoxysilane | Silane surface treatment, 97% | Alfa Aesar, Ward Hill, MA |
| PM | 1-methoxy-2-propanol | Alfa Aesar, Ward Hill, MA |
| Vazo 67 | 2,2'-Azobis(2-methylbutyronitrile) | Sigma-Aldrich Chemical Company, Milwaukee, WI |

Preparative Example 1. Synthesis of Silane Functional Polymers

Synthesis of Polymer Solution I

In an 8 ounce brown bottle, 27 g of isooctyl acrylate, 3.0 g of hydroethyl acrylate, 2.25 g of 3-mercaptopropyl trimethoxysilane, 80 g ethyl acetate, and 0.15 g of Vazo 67 were mixture together. The mixture was bubbled under $N_2$ for 20 min, then, the mixture was placed in an oil bath at 70° C. for 24 hours. This resulted in an optical clear solution with a wt % solids of 31.04%.

Preparation of Optical Coupling Material

Into a 2 L round-bottom flask equipped with a dropping funnel, temperature controller, paddle stirrer, and distilling head, was charged 177 g of NTB-1 sol (15% wt aqueous titanium dioxide sol with pH at 4, available from Denko Corporation, Japan) and 200 g of 1-methoxy-2-propanol, which were mixed together. 3.24 g of phenyltrimethoxysilane, 30 g of toluene, and Polymer Solution I was added under rapid stirring. After 15 min, the temperature was raised to 48° C. and an additional 240 g of toluene was added. The mixture was then heated to 80° C. for 16 hours.

The temperature was allowed to return to room temperature and the mixture was then transferred into a round flask. The solvent was removed using a rotary evaporator to yield a white wet-cake like materials. Then an additional 400 g of toluene was added. The solvents were further removed using a rotary evaporator. The final product was a dispersion of surface treated $TiO_2$ nanoparticles in toluene. The weight percent solids in the dispersions are given in the table below.

The solutions were coated on primed PET using a glass rod. The coated samples were dried in a vacuum oven for 5 minutes at 65° C. After drying, the samples yielded optically clear and sticky coatings with bluish color in thick areas. The tack was measured as described elsewhere and the refractive indexes of the materials were measured using a Metricon MODEL 2010 prism coupler (Metricon Corporation Inc. Pennington, N.J.) at 632.8 nm and are reported in the table below.

Example 12: Patterned Optical Coupling Layer on Glass

A release coated template layer was constructed as in Example 1.

Backfill Coating

A piece of the template film slightly larger than 5.1 cm×7.6 cm (2 inch×3 inch) was adhered to a 1 mm thick 5.1 cm×7.6 cm (2 inch×3 inch) glass microscope slide (available from VWR International, Radnor Pa.) with tape. The glass slide and sample were then put on a Model WS-6505-6npp/lite spin coater (available from Laurell Technologies Corporation, North Wales Pa.) directly on the vacuum chuck. A vacuum of 64 kPa (19 inches of Hg) was applied to hold the sample to the chuck. The spin coater was programmed for 500 RPM for 5 seconds (coating application step) then 1000 RPM for 15 sec (spin step), then 1000 RPM for 20 seconds (dry step). Approximately 1-2 mL of the optical coupling layer described above was applied to the template film during the coating application portion of the spin cycle, to produce a backfilled sample.

The sample was removed from spin coater and placed on a hotplate at 50° C. for 30 minutes, covered with an aluminum tray. The sample was then allowed to cool to room temperature. The sample was laminated at 230° F. (110° C.), coating side down, to a 1 mm thick 5.1 cm×7.6 cm (2 inch×3 inch) glass microscope slide (available from VWR International, Radnor Pa.) using a thermal film laminator (GBC Catena 35, GBC Document Finishing, Lincolnshire, Ill.). The laminated sample was allowed cool to room temperature. The laminated sample was then imaged with a nickel on quartz phototool through the glass slide in a mask aligner.

The template film was removed, and the uncured areas allowed to reflow for 1-5 minutes at room temperature. The sample was then cured in a belt fed cure chamber (RPC industries) fitted with a Fusion H bulb in nitrogen (1 pass, 25 fpm). The sample was removed from the chamber, and cooled to room temperature. This process produced a patterned, nanostructured sample where the unstructured areas retained material but did not retain structure.

Example 13 uses the procedure disclosed in FIG. 9.

Example 13: Embedded Low Index Dyad

A release coated template layer was constructed as in Example 1.

Backfill Coating

A piece of the template film slightly larger than 5.1 cm×7.6 cm (2 inch×3 inch) was adhered to a 1 mm thick 5.1 cm×7.6 cm (2 inch×3 inch) glass microscope slide (available from VWR International, Radnor Pa.) with tape. The glass slide and sample were then put on a Model WS-6505-6npp/lite spin coater (available from Laurell Technologies Corporation, North Wales Pa.) directly on the vacuum chuck. A vacuum of 64 kPa (19 inches of Hg) was applied to hold the sample to the chuck. The spin coater was programmed for 500 RPM for 5 seconds (coating application step) then 1000

RPM for 15 sec (spin step), then 1000 RPM for 20 seconds (dry step). Approximately 1-2 mL of optical coupling material described in Example 12 was applied to the template film during the coating application portion of the spin cycle, to produce a backfilled sample.

The sample was removed from spin coater and placed on a hotplate at 50° C. for 30 minutes, covered with an aluminum tray. The sample was then allowed to cool to room temperature. The sample was laminated at 70° F. (21.1° C.), coating side down, to a piece of polyester using a thermal film laminator (GBC Catena 35, GBC Document Finishing, Lincolnshire, Ill.).

Vinyl silsesquioxane was prepared as disclosed in Example 9.

The template film was removed, leaving a structured film on unprimed PET. A piece of the structured film slightly larger than 5.1 cm×7.6 cm (2 inch×3 inch) was adhered to a 1 mm thick 5.1 cm×7.6 cm (2 inch×3 inch) glass microscope slide (available from VWR International, Radnor Pa.) with tape, structure side up. The glass slide and sample were then put on a Model WS-6505-6npp/lite spin coater (available from Laurell Technologies Corporation, North Wales Pa.) directly on the vacuum chuck. A vacuum of 64 kPa (19 inches of Hg) was applied to hold the sample to the chuck. The spin coater was programmed for 500 RPM for 5 seconds (coating application step) then 1000 RPM for 15 sec (spin step), then 1000 RPM for 20 seconds (dry step). Approximately 1-2 mL of the vinyl SSQ radiation curable system was applied to the template film during the coating application portion of the spin cycle, to produce a backfilled sample.

The sample was removed from spin coater and placed on a hotplate at 50° C. for 30 minutes, covered with an aluminum tray. The sample was then allowed to cool to room temperature. The sample was laminated at 230° F. (110° C.), coating side down, to a 1 mm thick 5.1 cm×7.6 cm (2 inch×3 inch) glass microscope slide (available from VWR International, Radnor Pa.) using a thermal film laminator (GBC Catena 35, GBC Document Finishing, Lincolnshire, Ill.). The laminated sample was allowed cool to room temperature.

The sample was then cured in a belt fed cure chamber (RPC industries) fitted with a Fusion H bulb in nitrogen (1 pass, 25 fpm). The sample was removed from the chamber, and cooled to room temperature. The unprimed PET was then removed from the sample. This process produced a sample with embedded nanostructure, and a smooth top. The uncured areas were allowed to reflow for 1-5 minutes at room temperature. The sample was then cured in a belt fed cure chamber (RPC industries) fitted with a Fusion H bulb in nitrogen (1 pass, 25 fpm). The sample was removed from the chamber, and cooled to room temperature. This process produced a patterned, nanostructured sample where the unstructured areas retained material but did not retain structure.

Example 14: High Index Backfill on Top of Vinyl Silsesquioxane

A piece of the template film slightly larger than 5.1 cm×7.6 cm (2 inch×3 inch) was adhered to a 1 mm thick 5.1 cm×7.6 cm (2 inch×3 inch) glass microscope slide (available from VWR International, Radnor Pa.) with tape. The glass slide and sample were then put on a Model WS-6505-6npp/lite spin coater (available from Laurell Technologies Corporation, North Wales Pa.) directly on the vacuum chuck. A vacuum of 64 kPa (19 inches of Hg) was applied to hold the sample to the chuck. The spin coater was programmed for 500 RPM for 5 seconds (coating application step) then 1000 RPM for 15 sec (spin step), then 1000 RPM for 20 seconds (dry step). Approximately 1-2 milliliters of the optical coupling material was applied to the template film during the coating application portion of the spin cycle, to produce a backfilled sample.

The sample was removed from spin coater and placed on a hotplate at 50° C. for 30 minutes, covered with an aluminum tray. laminated at 230° F. (110° C.), coating side down, to a film of PET using a thermal film laminator (GBC Catena 35, GBC Document Finishing, Lincolnshire, Ill.). The laminated sample was allowed cool to room temperature. The laminated sample was then cured under UV lights with a UV processor (2 passes). The template film was then removed from the sample, leaving a cured layer on the PET.

The PET sample was adhered to a 1 mm thick 5.1 cm×7.6 cm (2 inch×3 inch) glass microscope slide (available from VWR International, Radnor Pa.) with tape. The glass slide and sample were then put on a Model WS-6505-6npp/lite spin coater (available from Laurell Technologies Corporation, North Wales Pa.) directly on the vacuum chuck. A vacuum of 64 kPa (19 inches of Hg) was applied to hold the sample to the chuck. The spin coater was programmed for 500 RPM for 5 seconds (coating application step) then 1000 RPM for 15 sec (spin step), then 1000 RPM for 20 seconds (dry step). Approximately 1-2 milliliters of the vinyl SSQ radiation curable system was applied to the template film during the coating application portion of the spin cycle, to a low index adhesion layer. The sample was removed from spin coater and placed on a hotplate at 50° C. for 30 minutes, covered with an aluminum tray. laminated at 230° F. (110° C.), coating side down, to a 1 mm thick 5.1 cm×7.6 cm (2 inch×3 inch) glass microscope slide (available from VWR International, Radnor Pa.) using a thermal film laminator (GBC Catena 35, GBC Document Finishing, Lincolnshire, Ill.). The laminated sample was allowed cool to room temperature. The laminated sample was then cured under UV. The template film was then removed from the sample, leaving a cured layer on the glass.

Following are a list of embodiments of the present disclosure.

Item 1 is a method of making patterned structured solid surfaces comprising filling a structured template with backfill material to produce a structured transfer film, and laminating the structured transfer film to a receptor substrate, wherein the receptor substrate comprises a patterned adhesion promotion layer.

Item 2 is the method of item 1, further comprising removing the structured template layer, thereby leaving patterned structured backfill material on the receptor substrate.

Item 3 is the method of item 1, wherein the backfill comprises a silsesquioxane.

Item 4 is the method of item 1, wherein the structured transfer film is temporarily laminated to a release liner.

Item 5 is the method of item 1, wherein the receptor substrate comprises glass, active matrix backplane, metal sheet, metal foil, ceramic, silicon, polymer, or composite.

Item 6 is a method of making structured solid surfaces comprising filling a structured template with backfill material to produce a structured transfer film, wherein the backfill material comprises a silsesquioxane, laminating the structured transfer film to a receptor substrate, curing the sample, and removing the structured template layer, thereby leaving structured backfill material on the receptor substrate.

Item 7 is the method of item 6, wherein the structured transfer film is temporarily laminated to a liner.

Item 8 is the method of item 6, wherein the receptor substrate glass, active matrix backplane, metal sheet, metal foil, ceramic, silicon, polymer, or composite.

Item 9 is a method of making structured solid surfaces comprising filling a structured template with backfill material to produce a structured transfer film, laminating the structured transfer film to a receptor substrate, patternwise curing the backfill material to produce cured areas and uncured areas in the structured transfer film, removing the structured template allowing the uncured areas to reflow, and blanket curing the structured template.

Item 10 is the method of item 9, further comprising removing the structured template layer, thereby leaving patterned structured backfill material on the receptor substrate.

Item 11 is the method of item 9, wherein the backfill comprises a silsesquioxane.

Item 12 is the method of item 9, wherein the structured transfer film is temporarily laminated to a release liner.

Item 13 is the method of item 9, wherein the receptor substrate comprises glass, metal sheet, metal foil, ceramic, silicon, polymer, or composite.

Item 14 is the method of item 9, wherein patternwise curing comprises photocuring through a photomask.

Item 15 is the method of item 9, wherein patternwise curing comprises using a rastered laser.

Item 16 is the method of item 9, wherein allowing the uncured areas to reflow further comprises applying heat.

Item 17 is a method of making structured solid surfaces comprising filling a structured template with backfill material to produce a structured transfer film, patternwise curing the backfill material, laminating the structured transfer film to a receptor substrate, removing the structured template layer, and blanket curing the structured template layer.

Item 18 is the method of item 17, wherein the patternwise curing is performed in an oxygen environment.

Item 19 is the method of item 17, wherein one or more layers are applied over the pattern cured backfilled transfer tape before lamination to increase adhesion of the backfilled layer to the receptor substrate.

Item 20 is the method of item 17, wherein the backfill comprises a silsesquioxane.

Item 21 is the method of item 17, wherein the structured transfer film is temporarily laminated to a release liner Item 22 is the method item 17, wherein the receptor substrate comprises glass, metal sheet, metal foil, ceramic, silicon, polymer, or composite.

Item 23 is the method of item 17, wherein patternwise curing comprises photocuring through a photomask.

Item 24 is the method of item 17, wherein the patternwise curing comprises using a rastered laser.

Item 25 is the method of item 17, wherein allowing the uncured areas to reflow further comprise applying heat.

Item 26 is a method of making structured solid surfaces comprising filling a structured template with backfill material to produce a structured transfer film, patternwise curing the backfill material, laminating the structured transfer film to a receptor substrate, blanket curing the structured transfer film, and removing the structured template layer.

Item 27 is the method of item 26, wherein the backfill comprises a silsesquioxane.

Item 28 is the method of item 26, wherein the structured transfer film is temporarily laminated to a release liner before patternwise curing the backfill material.

Item 29 is the method of item 26, wherein the structured transfer film is temporarily laminated to a release liner after patternwise curing the backfill material.

Item 30 is the method of item 26, wherein the receptor substrate comprises glass, metal sheet, metal foil, ceramic, silicon, polymer, or composite.

Item 31 is the method of item 26, wherein patternwise curing comprises photocuring through a photomask.

Item 32 is the method of item 26, wherein the patternwise curing comprises using a rastered laser.

Item 33 is the method of item 26, wherein allowing the uncured areas to reflow further comprises applying heat.

Item 34 is the method of item 26, wherein areas of low adhesion are removed from the receptor substrate creating vias.

All references and publications cited herein are expressly incorporated herein by reference in their entirety into this disclosure, except to the extent they may directly contradict this disclosure. Although specific embodiments have been illustrated and disclosed herein, it will be appreciated by those of ordinary skill in the art that a variety of alternate and/or equivalent implementations can be substituted for the specific embodiments shown and disclosed without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A method of making patterned structured solid surfaces comprising:
   filling a structured template with backfill material to produce a structured transfer film;
   patternwise curing the backfill material to produce an intermediate transfer film comprising cured areas and uncured areas in the structured transfer film;
   laminating the intermediate transfer film to a receptor substrate;
   removing the structured template and allowing the uncured areas to reflow such that the cured areas form structured areas and the uncured areas form unstructured areas of a laminated backfill layer; and
   blanket curing the structured and unstructured areas of the laminated backfill layer.

2. A method of making patterned structured solid surfaces comprising:
   filling a structured template with backfill material to produce a structured transfer film;
   patternwise curing the backfill material in an oxygen environment to produce an intermediate transfer film comprising cured areas and uncured areas in the structured transfer film;
   laminating the intermediate transfer film to a receptor substrate;
   removing the structured template such that the cured areas form structured areas and the uncured areas form unstructured areas of a laminated backfill layer; and
   blanket curing the structured and unstructured areas of the laminated backfill layer.

3. A method of making patterned structured solid surfaces according to claim 1, wherein one or more layers are applied over the intermediate transfer film before lamination to increase adhesion of the backfilled material to the receptor substrate.

4. A method of making patterned structured solid surfaces according to claim 1, wherein the backfill material comprises a silsesquioxane.

5. A method of making patterned structured solid surfaces according to claim 1, wherein the intermediate transfer film is temporarily laminated to a release liner.

6. A method of making patterned structured solid surfaces according to claim 1, wherein the receptor substrate comprises glass, metal sheet, metal foil, ceramic, silicon, polymer, or composite.

7. A method of making patterned structured solid surfaces according to claim 1, wherein patternwise curing comprises photocuring through a photomask.

8. A method of making patterned structured solid surfaces according to claim 1, wherein allowing the uncured areas to reflow further comprise applying heat.

9. The method of claim 1, wherein the patternwise curing comprises exposing select portions of the backfill material to a laser beam.

10. The method of claim 1, wherein the structured template comprises a release coating.

11. A method for making a patterned structured solid surface, the method comprising:
 filling a structured template with backfill material to produce a structured transfer film, the structured template comprising nanostructures or microstructures;
 laminating the structured transfer film onto a receptor substrate;
 curing the backfill material patternwise to form an intermediate laminated film comprising cured areas and uncured areas of backfill material;
 removing the structured template and allowing the uncured areas to reflow to form unstructured areas; and
 blanket curing the cured and uncured areas of the backfill material.

12. The method of claim 11, wherein the patternwise curing is performed in an oxygen environment.

13. The method of claim 11, wherein one or more layers are applied over the structured transfer film before lamination to increase adhesion of the backfill material to the receptor substrate.

14. The method of claim 11, wherein the backfill material comprises a silsesquioxane.

15. The method of claim 11, wherein the structured transfer film is temporarily laminated to a release liner.

16. The method of claim 11, wherein the receptor substrate comprises glass, metal sheet, metal foil, ceramic, silicon, polymer, or composite.

17. The method of claim 11, wherein patternwise curing comprises photocuring through a photomask or exposing select portions of the backfill material to a laser beam.

18. The method of claim 11, wherein allowing the uncured areas to reflow further comprises applying heat.

19. The method of claim 11, wherein the structured template comprises a release coating.

* * * * *

UNITED STATES PATENT AND TRADEMARK OFFICE
CERTIFICATE OF CORRECTION

PATENT NO. : 10,052,856 B2
APPLICATION NO. : 15/257099
DATED : August 21, 2018
INVENTOR(S) : Free et al.

It is certified that error appears in the above-identified patent and that said Letters Patent is hereby corrected as shown below:

On the Title Page

Page 2, Column 2 item (56), (Other Publications)
Line 4, Delete "68830C1-68830C1-9" and insert -- 68830C1-9. --, therefor.

In the Specification

Column 7
Line 20, Delete "intermedicae" and insert -- intermediate --, therefor.

Column 12
Line 57, Delete "syndiodactic" and insert -- syndiotactic --, therefor.

Column 13
Line 66, Delete "syndiodactic" and insert -- syndiotactic --, therefor.

Column 16
Line 55, Delete "cyclopentadenyl" and insert -- cyclopentadienyl --, therefor.

Column 17
Line 11 (Approx.), After "vinyltriethoxysilane" insert -- (1) --.

Column 18
Line 33 (Approx.), After "Inc" insert -- . --.

Column 22
Line 8, Delete "(pentaerithrotol" and insert -- (pentaerythritol --, therefor.

Column 22
Line 39, Delete "acylate/" and insert -- acrylate/ --, therefor.

Signed and Sealed this
Sixteenth Day of April, 2019

Andrei Iancu
*Director of the United States Patent and Trademark Office*

Column 22
Lines 43-44, Delete "(pentaerithrotol" and insert -- (pentaerythritol --, therefor.

Column 22
Line 64, Delete "CLEARSIL," and insert -- CLEARSIL --, therefor.

Column 22
Line 65, Delete "Dubvai," and insert -- Dubai, --, therefor.

Column 23
Line 10, Delete "dessicator" and insert -- desiccator --, therefor.

Column 26
Line 56, Delete "redisolving" and insert -- redissolving --, therefor.

Column 28
Line 2, Delete "ACTINIC".

Column 28
Lines 42-43, Delete "Vinyl silsesquioxane was prepared as disclosed in Example 9." and insert the same on Column 28, Line 43, as a new paragraph.

Column 33
Line 47, After "liner" insert -- . --.